(12) United States Patent
Ishida

(10) Patent No.: US 12,355,204 B2
(45) Date of Patent: Jul. 8, 2025

(54) GAS LASER APPARATUS AND ELECTRONIC DEVICE MANUFACTURING METHOD

(71) Applicant: Gigaphoton Inc., Tochigi (JP)

(72) Inventor: Keisuke Ishida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 186 days.

(21) Appl. No.: 18/447,520

(22) Filed: Aug. 10, 2023

(65) Prior Publication Data

US 2023/0396033 A1  Dec. 7, 2023

Related U.S. Application Data

(63) Continuation of application No. PCT/JP2021/012707, filed on Mar. 25, 2021.

(51) Int. Cl.
*H01S 3/134* (2006.01)
*G03F 7/00* (2006.01)
(Continued)

(52) U.S. Cl.
CPC ............ *H01S 3/134* (2013.01); *G03F 7/2004* (2013.01); *G03F 7/70025* (2013.01);
(Continued)

(58) Field of Classification Search
CPC ........ H01S 3/134; H01S 3/038; H01S 3/1305; H01S 3/225; H01S 3/08004;
(Continued)

(56) References Cited

U.S. PATENT DOCUMENTS 7,072,375 B2 * 7/2006 Ariga ..................... H01S 3/134
372/55
7,382,816 B2 6/2008 Ariga et al.
(Continued)

FOREIGN PATENT DOCUMENTS

JP 2003-318831 A 11/2003
JP 2006-080279 A 3/2006
(Continued)

OTHER PUBLICATIONS

International Search Report issued in PCT/JP2021/012707; mailed Jun. 1, 2021.
(Continued)

*Primary Examiner* — Hung V Nguyen
(74) *Attorney, Agent, or Firm* — Studebaker Brackett PLLC

(57) ABSTRACT

A gas laser apparatus includes a laser oscillator including a pair of discharge electrodes disposed to face each other and configured to generate light from laser gas upon application of voltage, and a laser-side resonator in which the light resonates; an amplifier including an amplification unit and an amplification-side resonator; a beam splitter configured to reflect a part of the light from the laser-side resonator; an optical sensor configured to detect the light reflected by the beam splitter; and a processor configured to control the voltage based on an output from the optical sensor. The amplification-side resonator includes a rear mirror and an output coupling mirror. The laser-side resonator includes a grating and an output coupling mirror. The processor maintains the voltage at a constant value equal to or larger than a threshold of the voltage when the voltage is to be smaller than the threshold.

17 Claims, 20 Drawing Sheets

(51) Int. Cl.
    *G03F 7/20*          (2006.01)
    *H01S 3/038*       (2006.01)
    *H01S 3/13*         (2006.01)
    *H01S 3/225*       (2006.01)

(52) U.S. Cl.
    CPC ............ *G03F 7/7055* (2013.01); *H01S 3/038* (2013.01); *H01S 3/1305* (2013.01); *H01S 3/225* (2013.01)

(58) Field of Classification Search
    CPC .. H01S 3/2251; H01S 3/08009; H01S 3/2366; G03F 7/2004; G03F 7/70025; G03F 7/7055
    See application file for complete search history.

(56) References Cited

U.S. PATENT DOCUMENTS

| | | | |
|---|---|---|---|
| 8,514,899 B2 * | 8/2013 | Onose | ................... H01S 3/2316 |
| | | | 372/21 |
| 8,563,956 B1 | 10/2013 | Melchior et al. | |
| 8,817,839 B2 * | 8/2014 | Wakabayashi | .......... H01S 3/083 |
| | | | 372/55 |
| 2005/0157760 A1 | 7/2005 | Rice et al. | |
| 2006/0072636 A1 | 4/2006 | Jacques | |
| 2008/0095209 A1 | 4/2008 | Wakabayashi et al. | |
| 2016/0254634 A1 | 9/2016 | Asayama et al. | |
| 2017/0317464 A1 | 11/2017 | Kurosawa et al. | |

FOREIGN PATENT DOCUMENTS

| | | |
|---|---|---|
| JP | 2008-078372 A | 4/2008 |
| JP | 2008515230 A | 5/2008 |
| JP | 4364757 B2 | 11/2009 |
| JP | 5513653 B2 | 6/2014 |
| JP | 2015-523739 A | 8/2015 |
| WO | 2015/098985 A1 | 7/2015 |
| WO | 2016/142995 A1 | 9/2016 |

OTHER PUBLICATIONS

Written Opinion issued in PCT/JP2021/012707; mailed Jun. 1, 2021.

* cited by examiner

GAS LASER APPARATUS AND ELECTRONIC DEVICE MANUFACTURING METHOD

CROSS-REFERENCE TO RELATED APPLICATIONS

The present application is a continuation application of International Application No. PCT/JP2021/012707, filed on Mar. 25, 2021, the entire contents of which are hereby incorporated by reference.

BACKGROUND

1. Technical Field

The present disclosure relates to a gas laser apparatus and an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to output a laser beam having a wavelength of approximately 248.0 nm and an ArF excimer laser apparatus configured to output a laser beam having a wavelength of approximately 193.4 nm.

The KrF excimer laser apparatus and the ArF excimer laser apparatus each have a wide spectrum line width of 350 pm to 400 pm for spontaneous oscillation light. Thus, chromatic aberration occurs in some cases when a projection lens is made of a material that transmits ultraviolet such as KrF and ArF laser beams. This can lead to resolving power decrease. Thus, the spectrum line width of a laser beam output from the gas laser apparatus needs to be narrowed so that chromatic aberration becomes negligible. To narrow the spectrum line width, a line narrowing module (LNM) including a line narrowing element (for example, etalon or grating) is provided in a laser resonator of the gas laser apparatus in some cases. In the following, a gas laser apparatus that achieves narrowing of the spectrum line width is referred to as a line narrowed gas laser apparatus.

LIST OF DOCUMENTS

Patent Documents

Patent Document 1: Japanese Patent No. 4364757
Patent Document 2: Japanese Patent No. 5513653
Patent Document 3: U.S. Pat. No. 7,382,816

SUMMARY

A gas laser apparatus according to an aspect of the present disclosure may include a laser oscillator including a pair of discharge electrodes and a laser-side resonator, the pair of discharge electrodes being disposed to face each other and configured to generate light from laser gas upon application of voltage, the laser-side resonator being configured to cause the light to resonate; an amplifier including an amplification unit and an amplification-side resonator, the amplification unit being configured to amplify the light transmitting through the laser-side resonator, the amplification-side resonator being configured to cause the light amplified by the amplification unit to resonate; a beam splitter configured to reflect a part of the light from the laser-side resonator; an optical sensor configured to detect the light reflected by the beam splitter; and a processor configured to control the voltage based on an output from the optical sensor. The amplification-side resonator may include a rear mirror and an amplification-side output coupling mirror. The rear mirror may transmit a part of the light from the laser-side resonator, reflect another part of the light from the laser-side resonator toward the laser-side resonator, transmit a part of the light amplified by the amplification unit toward the laser-side resonator, and reflect another part of the light amplified by the amplification unit. The amplification-side output coupling mirror may reflect a part of the light amplified by the amplification unit and transmit another part of the light amplified by the amplification unit. The laser-side resonator may include a grating that reflects the light generated from the laser gas, and a laser-side output coupling mirror that reflects a part of the light generated from the laser gas, transmits another part of the light generated from the laser gas toward the beam splitter, and reflects a part of the light from the rear mirror toward the beam splitter. The processor may maintain the voltage at a constant value equal to or larger than a threshold of the voltage when the voltage is to be smaller than the threshold.

A gas laser apparatus according to an aspect of the present disclosure may include a laser oscillator including a pair of discharge electrodes and a laser-side resonator, the pair of discharge electrodes being disposed to face each other and configured to generate light from laser gas upon application of voltage, the laser-side resonator being configured to cause the light to resonate; an amplifier including an amplification unit and an amplification-side resonator, the amplification unit being configured to amplify the light transmitting through the laser-side resonator, the amplification-side resonator being configured to cause the light amplified by the amplification unit to resonate; a beam splitter configured to reflect a part of the light from the laser-side resonator; an optical sensor configured to detect the light reflected by the beam splitter; and a processor configured to control the voltage based on an output from the optical sensor. The amplification-side resonator may include a rear mirror and an amplification-side output coupling mirror. The rear mirror may transmit a part of the light from the laser-side resonator, reflect another part of the light from the laser-side resonator toward the laser-side resonator, transmit a part of the light amplified by the amplification unit toward the laser-side resonator, and reflect another part of the light amplified by the amplification unit. The amplification-side output coupling mirror may reflect a part of the light amplified by the amplification unit and transmit another part of the light amplified by the amplification unit. The laser-side resonator may include a grating that reflects the light generated from the laser gas, and a laser-side output coupling mirror that reflects a part of the light generated from the laser gas, transmits another part of the light generated from the laser gas toward the beam splitter, and reflects a part of the light from the rear mirror toward the beam splitter. The processor may increase the voltage to a predetermined value larger than a threshold of the voltage when the voltage is to be smaller than the threshold.

An electronic device manufacturing method according to an aspect of the present disclosure may include generating a laser beam with a gas laser apparatus, outputting the laser beam to an exposure apparatus, and exposing a photosensitive substrate to the laser beam in the exposure apparatus to manufacture an electronic device. The gas laser apparatus may include a laser oscillator including a pair of discharge electrodes and a laser-side resonator, the pair of discharge electrodes being disposed to face each other and configured to generate light from laser gas upon application of voltage, the laser-side resonator being configured to cause the light to resonate; an amplifier including an amplification unit and an amplification-side resonator, the amplification unit being configured to amplify the light transmitting through the laser-side resonator, the amplification-side resonator being configured to cause the light amplified by the amplification unit to resonate; a beam splitter configured to reflect a part of the light from the laser-side resonator; an optical sensor configured to detect the light reflected by the beam splitter; and a processor configured to control the voltage based on an output from the optical sensor. The amplification-side resonator may include a rear mirror and an amplification-side output coupling mirror. The rear mirror may transmit a part of the light from the laser-side resonator, reflect another part of the light from the laser-side resonator toward the laser-side resonator, transmit a part of the light amplified by the amplification unit toward the laser-side resonator, and reflect another part of the light amplified by the amplification unit. The amplification-side output coupling mirror may reflect a part of the light amplified by the amplification unit and transmits another part of the light amplified by the amplification unit. The laser-side resonator may include a grating that reflects the light generated from the laser gas, and a laser-side output coupling mirror that reflects a part of the light generated from the laser gas, transmits another part of the light generated from the laser gas toward the beam splitter, and reflects a part of the light from the rear mirror toward the beam splitter. The processor may maintain the voltage at a constant value equal to or larger than a threshold of the voltage when the voltage is to be smaller than the threshold.

An electronic device manufacturing method according to an aspect of the present disclosure may include generating a laser beam with a gas laser apparatus, outputting the laser beam to an exposure apparatus, and exposing a photosensitive substrate to the laser beam in the exposure apparatus to manufacture an electronic device. The gas laser apparatus may include a laser oscillator including a pair of discharge electrodes and a laser-side resonator, the pair of discharge electrodes being disposed to face each other and configured to generate light from laser gas upon application of voltage, the laser-side resonator being configured to cause the light to resonate; an amplifier including an amplification unit and an amplification-side resonator, the amplification unit being configured to amplify the light transmitting through the laser-side resonator, the amplification-side resonator being configured to cause the light amplified by the amplification unit to resonate; a beam splitter configured to reflect a part of the light from the laser-side resonator; an optical sensor configured to detect the light reflected by the beam splitter; and a processor configured to control the voltage based on an output from the optical sensor. The amplification-side resonator may include a rear mirror and an amplification-side output coupling mirror. The rear mirror may transmit a part of the light from the laser-side resonator, reflect another part of the light from the laser-side resonator toward the laser-side resonator, transmit a part of the light amplified by the amplification unit toward the laser-side resonator, and reflect another part of the light amplified by the amplification unit. The amplification-side output coupling mirror may reflect a part of the light amplified by the amplification unit and transmit another part of the light amplified by the amplification unit. The laser-side resonator may include a grating that reflects the light generated from the laser gas, and a laser-side output coupling mirror that reflects a part of the light generated from the laser gas, transmits another part of the light generated from the laser gas toward the beam splitter, and reflects a part of the light from the rear mirror toward the beam splitter. The processor may increase the voltage to a predetermined value larger than a threshold of the voltage when the voltage is to be smaller than the threshold.

BRIEF DESCRIPTION OF THE DRAWINGS

Embodiments of the present disclosure will be described below merely as examples with reference to the accompanying drawings.

DESCRIPTION OF EMBODIMENTS

1. Electronic device manufacturing device used in electronic device exposure process
2. Gas laser apparatus of comparative example
   2.1 Configuration
   2.2 Operation
   2.3 Problem
3. Gas laser apparatus of Embodiment 1
   3.1 Configuration
   3.2 Operation
   3.3 Effect
4. Gas laser apparatus of Embodiment 2
   4.1 Configuration
   4.2 Operation
   4.3 Effect
5. Gas laser apparatus of Embodiment 3
   5.1 Configuration
   5.2 Operation
   5.3 Effect Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
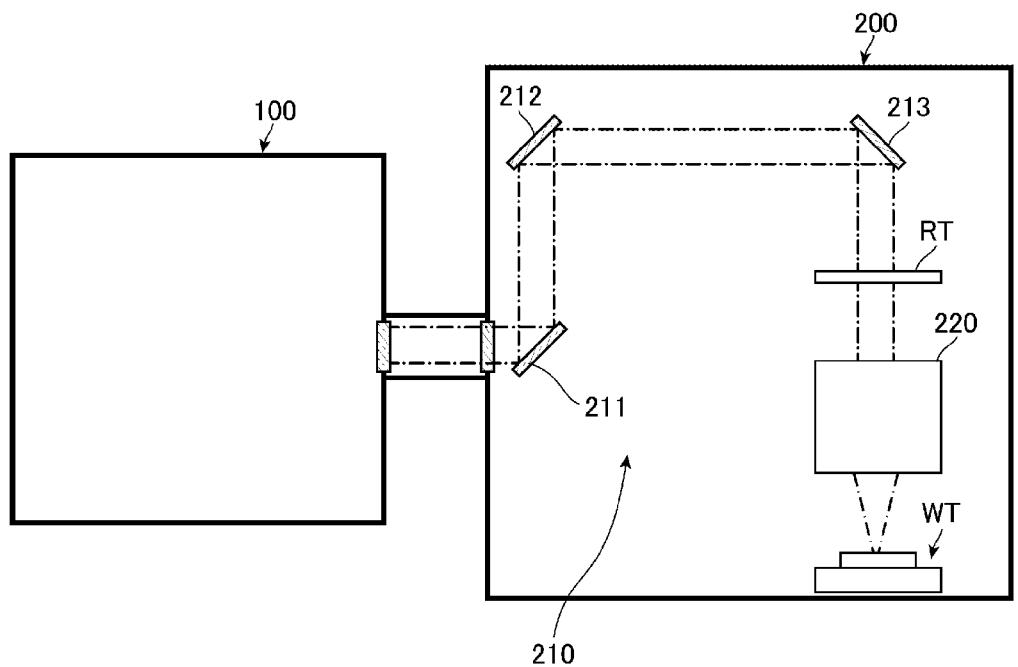
FIG. 1 is a schematic diagram illustrating an example of the entire schematic configuration of an electronic device manufacturing device.

1. Electronic Device Manufacturing Device Used in Electronic Device Exposure Process FIG. 1 is a schematic diagram illustrating an example of the entire schematic configuration of an electronic device manufacturing device used in an exposure process of an electronic device. As illustrated in FIG. 1, the manufacturing device used in the exposure process includes a gas laser apparatus 100 and an exposure apparatus 200. The exposure apparatus 200 includes an illumination optical system 210 including a plurality of mirrors 211, 212, and 213, and a projection optical system 220. The illumination optical system 210 illuminates a reticle pattern on a reticle stage RT with a laser beam from the gas laser apparatus 100. The laser beam transmitting through a reticle is imaged on a non-illustrated workpiece disposed on a workpiece table WT by reduced projection through the projection optical system 220. The workpiece is a photosensitive substrate such as a semiconductor wafer on which a photoresist is applied. The exposure apparatus 200 translates the reticle stage RT and the workpiece table WT in synchronization to expose the workpiece to the laser beam reflected by the reticle pattern. A device pattern is transferred onto the semiconductor wafer through the exposure process as described above, and accordingly, a semiconductor device as the electronic device can be manufactured.

2. Gas Laser Apparatus of Comparative Example 2.1 Configuration

The gas laser apparatus 100 of a comparative example will be described below. The comparative example of the present disclosure is an example that the applicant recognizes as known only by the applicant, but is not a publicly known example that is recognized by the applicant.

Figure 2:
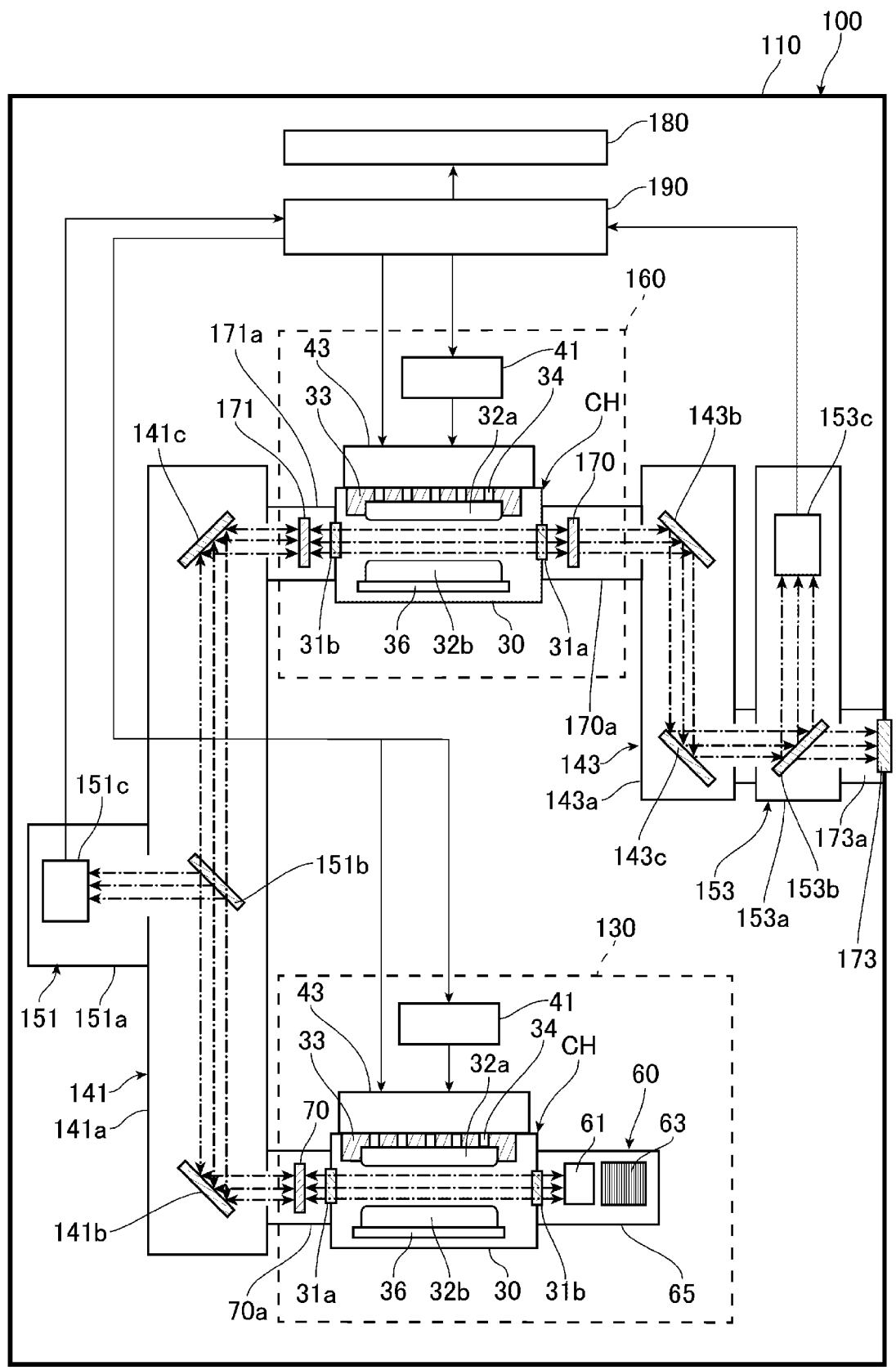
FIG. 2 is a schematic diagram illustrating an example of the entire schematic configuration of a gas laser apparatus of a comparative example.

FIG. 2 is a schematic diagram illustrating an example of the entire schematic configuration of the gas laser apparatus 100 of the present example. The gas laser apparatus 100 is an ArF excimer laser apparatus that uses, for example, mixed gas containing argon (Ar), fluorine ($F_2$), and neon (Ne). In this case, the gas laser apparatus 100 outputs a pulse laser beam having a central wavelength of approximately 193.4 nm. The gas laser apparatus 100 may be any other gas laser apparatus than an ArF excimer laser apparatus, and may be a KrF excimer laser apparatus that uses, for example, mixed gas containing krypton (Kr), $F_2$, and Ne. In this case, the gas laser apparatus 100 outputs a pulse laser beam having a central wavelength of approximately 248.0 nm. The mixed gas containing Ar, $F_2$, and Ne as laser media and the mixed gas containing Kr, $F_2$, and Ne as laser media are referred to as laser gas in some cases.

The gas laser apparatus 100 of the present example mainly includes a housing 110, a laser oscillator 130 as a master oscillator, a light transmission unit 141, a detection unit 151 as a first detection unit on an oscillation side, an amplifier 160 as a power oscillator, a light transmission unit 143, a detection unit 153 as a second detection unit on an amplification side, a display unit 180, and a processor 190. The laser oscillator 130, the light transmission units 141 and 143, the detection units 151 and 153, the amplifier 160, the display unit 180, and the processor 190 are disposed in the internal space of the housing 110.

The laser oscillator 130 mainly includes a chamber device CH, a charger 41, a pulse power module 43, a line narrowing module 60, and an output coupling mirror 70 as a laser-side output coupling mirror.

FIG. 2 illustrates an internal configuration of the chamber device CH when viewed in a direction substantially orthogonal to the traveling direction of a laser beam. The chamber device CH mainly includes a housing 30, a pair of windows 31a and 31b, a pair of electrodes 32a and 32b, an insulating part 33, a feedthrough 34, and an electrode holder part 36.

The laser gas is supplied from a non-illustrated laser gas supply device to the internal space of the housing 30 through a non-illustrated pipe and encapsulated in the internal space. The internal space is a space in which light is generated through excitation of the laser gas.

The windows 31a and 31b are provided at positions facing each other at the housing 30. The window 31a is positioned on a front side in the traveling direction of a laser beam from the gas laser apparatus 100 to the exposure apparatus 200, and the window 31b is positioned on a rear side in the traveling direction. The windows 31a and 31b are each tilted at a Brewster angle relative to the traveling direction of the laser beam so that reflection of P-polarized light of the laser beam is prevented. The window 31a is disposed in a hole through a wall surface of the housing 30 on the front side, and the window 31b is disposed in a hole through a wall surface of the housing 30 on the rear side.

The electrodes 32a and 32b have longitudinal directions along the traveling direction of the laser beam and are disposed to face each other in the internal space of the housing 30. A space between the electrodes 32a and 32b in the housing 30 is sandwiched by the windows 31a and 31b. The electrodes 32a and 32b are discharge electrodes for exciting the laser medium by glow discharge. In the present example, the electrode 32a is a cathode and the electrode 32b is an anode.

The electrode 32a is supported by the insulating part 33. The insulating part 33 blocks an opening continuous with the housing 30. The insulating part 33 contains an insulating body. The insulating body is, for example, alumina ceramics having a low reactivity with $F_2$ gas. The feedthrough 34 made of a conductive member is disposed at the insulating part 33. The feedthrough 34 applies voltage supplied from the pulse power module 43 to the electrode 32a. The electrode 32b is supported by and electrically connected to the electrode holder part 36.

The charger 41 is a direct-current power source device configured to charge a non-illustrated capacitor provided in the pulse power module 43 at a predetermined voltage. The charger 41 is disposed outside the housing 30 and connected to the pulse power module 43. The pulse power module 43 includes a non-illustrated switch controlled by the processor 190. When the switch being turned off is turned on under control of the processor 190, the pulse power module 43 generates high voltage in pulses by increasing the voltage applied from the charger 41 and applies the high voltage to the electrodes 32a and 32b. When the high voltage is applied, insulation between the electrodes 32a and 32b breaks down and discharge occurs. The laser gas in the housing 30 is excited with energy of the discharge and transitions to a higher energy level. Thereafter, when transitioning to a lower energy level, the excited laser gas discharges light in accordance with the difference between the energy levels. The discharged light transmits through the windows 31a and 31b to the outside of the housing 30.

The line narrowing module 60 includes a prism 61, a grating 63, a non-illustrated rotation stage, and a housing 65. The prism 61, the grating 63, and the rotation stage are disposed in the internal space of the housing 65. An opening is continuous with the housing 65, and the housing 65 is connected to the rear side of the housing 30 through the opening.

The prism 61 expands the beam width of light output from the window 31b and causes the light to be incident on the grating 63. In addition, the prism 61 reduces the beam width of reflected light from the grating 63 and returns the light to the internal space of the housing 30 through the window 31b. The prism 61 is supported and rotated by the rotation stage. The incident angle of light on the grating 63 is changed as the prism 61 is rotated. Thus, the wavelength of light returning from the grating 63 to the housing 30 through the prism 61 can be selected by rotating the prism 61. One prism 61 is disposed in the example illustrated in FIG. 2. At least one prism needs to be disposed.

The surface of the grating 63 is made of a high reflective material and provided with a large number of grooves at a predetermined interval. The grating 63 is a dispersive optical element. Each groove has, for example, a right-triangular sectional shape. Light incident on the grating 63 from the prism 61 is reflected by the grooves and diffracted in a direction in accordance with the wavelength of the light. The grating 63 is disposed in such a Littrow arrangement that the incident angle of light incident on the grating 63 from the prism 61 matches the diffraction angle of diffracted light having a desired wavelength. Accordingly, light having a wavelength near the desired wavelength is returned to the housing 30 through the prism 61.

The output coupling mirror 70 faces the window 31a. The output coupling mirror 70 is coated with a partial reflection film. The output coupling mirror 70 transmits a part of a laser beam output from the housing 30 through the window 31a and reflects another part thereof back to the internal space of the housing 30 through the window 31a. For example, the output coupling mirror 70 may have a reflectance of substantially 40% to 60%. The output coupling mirror 70 is, for example, an element obtained by depositing a dielectric multi-layered film on a calcium fluoride substrate. The output coupling mirror is fixed through a non-illustrated damper to the internal space of an optical path pipe 70a connected to the front side of the housing 30.

A laser-side resonator in which light discharged from the laser gas resonates is constituted by the grating 63 and the output coupling mirror 70 provided with the housing 30 interposed therebetween. The housing 30 is disposed on the optical path of the laser-side resonator, and the light output from the housing 30 reciprocates between the grating 63 and the output coupling mirror 70. The reciprocating light is amplified each time the light passes through a laser gain space between the electrodes 32a and 32b. A part of the amplified light transmits through the output coupling mirror 70 as a pulse laser beam.

The light transmission unit 141 mainly includes a housing 141a and high reflectance mirrors 141b and 141c. The housing 141a has an opening at a connection part to the optical path pipe 70a and communicates with the optical path pipe 70a through the opening. The housing 141a has another opening at a connection part to an optical path pipe 171a to be described later and communicates with the optical path pipe 171a through the opening. The high reflectance mirrors 141b and 141c are disposed in the internal space of the housing 141a with their tilt angles adjusted. The high reflectance mirrors 141b and 141c are each, for example, a transparent substrate formed of synthetic quartz or calcium fluoride and having a surface coated with a reflective film that highly reflects a pulse laser beam. The high reflectance mirrors 141b and 141c are disposed on the optical path of the pulse laser beam from the output coupling mirror 70. The pulse laser beam is reflected by the high reflectance mirrors 141b and 141c and travels to a rear mirror 171 of the amplifier 160. At least a part of the laser beam transmits through the rear mirror 171.

The detection unit 151 mainly includes a housing 151a, a beam splitter 151b, and an optical sensor 151c. An opening is continuous with the housing 151a and has an edge connected around an opening continuous with the housing 141a. Accordingly, the housing 151a communicates with the housing 141a through the opening.

The beam splitter 151b is disposed on the optical path of the pulse laser beam between the high reflectance mirrors 141b and 141c in the internal space of the housing 141a. The beam splitter 151b is also disposed adjacent to the opening of the housing 141a continuous with the internal space of the housing 151a. The beam splitter 151b reflects, toward a light receiving surface of the optical sensor 151c, a part of the pulse laser beam traveling from the output coupling mirror 70 side of the laser oscillator 130 and reflected by the high reflectance mirror 141b. In addition, the beam splitter 151b transmits another part of the pulse laser beam to the high reflectance mirror 141c at high transmittance.

The optical sensor 151c is disposed in the internal space of the housing 151a. The optical sensor 151c measures the pulse energy of the pulse laser beam incident on the light receiving surface of the optical sensor 151c. The optical sensor 151c is electrically connected to the processor 190 and outputs a signal indicating the measured pulse energy to the processor 190. The processor 190 controls voltage of the electrodes 32a and 32b of the laser oscillator 130 based on the signal.

The amplifier 160 amplifies energy of the pulse laser beam output from the laser oscillator 130. The amplifier 160 has the same basic configuration as the laser oscillator 130 and includes a chamber device CH, a charger 41, and a pulse power module 43. Electrodes 32a and 32b of the amplifier 160 are an amplification unit configured to amplify the pulse laser beam from the laser oscillator 130.

The amplifier 160 also includes a Fabry-Perot resonator in which the pulse laser beam amplified by the electrodes 32a and 32b of the amplifier 160 resonates. The resonator is constituted by an output coupling mirror 170 as an amplification-side output coupling mirror and the rear mirror 171. The rear mirror 171 is provided between a window 31b of the amplifier 160 and the high reflectance mirror 141c, and the output coupling mirror 170 is provided between a window 31a of the amplifier 160 and a high reflectance mirror 143b of the light transmission unit 143. For example, the output coupling mirror 170 has a reflectance of substantially 10% to 30%, and the rear mirror 171 has a reflectance of substantially 50% to 90%. The rear mirror 171 transmits a part of the pulse laser beam from the laser oscillator 130 toward the electrodes 32a and 32b and reflects a part of the pulse laser beam amplified by the electrodes 32a and 32b toward a space between the electrodes 32a and 32b. The output coupling mirror 170 reflects a part of the pulse laser beam amplified by the electrodes 32a and 32b toward the space between the electrodes 32a and 32b and transmits another part of the pulse laser beam. The rear mirror 171 is disposed in the internal space of the optical path pipe 171a. The optical path pipe 171a is connected to a housing 30 of the amplifier 160 and encloses the window 31b of the amplifier 160. The output coupling mirror 170 is disposed in the internal space of an optical path pipe 170a. The optical path pipe 170a is connected to the housing 30 of the amplifier 160 and encloses the window 31a of the amplifier 160.

The light transmission unit 143 mainly includes a housing 143a and high reflectance mirrors 143b and 143c. The housing 143a has an opening at a connection part to the optical path pipe 170a and communicates with the optical path pipe 170a through the opening. The housing 143a has another opening at a connection part to a housing 153a to be described later and communicates with the housing 153a through the opening. The high reflectance mirrors 143b and 143c are disposed in the internal space of the housing 143a with their tilt angles adjusted. The high reflectance mirrors 143b and 143c each have the same configuration as the high reflectance mirrors 141b and 141c. The laser beam transmitting through the output coupling mirror 170 is reflected by the high reflectance mirrors 143b and 143c and travels to the detection unit 153.

The detection unit 153 mainly includes the housing 153a, a beam splitter 153b, and an optical sensor 153c. An opening is continuous with the housing 153a, and the housing 143a is connected around the opening. Accordingly, the housing 153a communicates with the housing 143a through the opening. The beam splitter 153b and the optical sensor 153c are disposed in the internal space of the housing 153a.

The beam splitter 153b is disposed on the optical path of the pulse laser beam transmitting through the output coupling mirror 170. The beam splitter 153b transmits, to an output window 173 at high transmittance, the pulse laser beam transmitting through the output coupling mirror 170 and reflects a part of the pulse laser beam toward a light receiving surface of the optical sensor 153c.

The optical sensor 153c measures the pulse energy of the pulse laser beam incident on the light receiving surface of the optical sensor 153c. The optical sensor 153c is electrically connected to the processor 190 and outputs a signal indicating the measured pulse energy to the processor 190. The processor 190 controls voltage of the electrodes 32a and 32b of the amplifier 160 based on the signal.

The detection unit 153 has an opening that is continuous from a side of the housing 153a on which the housing 143a is connected to the opposite side, and an optical path pipe 173a is connected around the opening. Accordingly, the housing 153a and the optical path pipe 173a communicate with each other. The optical path pipe 173a is connected to the housing 110. The housing 110 is provided with the output window 173 at a position surrounded by the optical path pipe 173a. Light transmitting through the beam splitter 153b of the detection unit 153 is output from the output window 173 to the exposure apparatus 200 outside the housing 110.

The internal spaces of the optical path pipes 70a, 170a, and 171a and the housings 30, 141a, 143a, 151a, and 153a are filled with purge gas. The purge gas includes inert gas such as high-purity nitrogen having a small amount of impurity such as oxygen. The purge gas is supplied from a non-illustrated purge gas supply source disposed outside the housing 110 to the internal spaces of the optical path pipes 70a, 170a, and 171a and the housings 30, 141a, 143a, 151a, and 153a through non-illustrated pipes.

The display unit 180 is a monitor configured to display the state of control by the processor 190 based on a signal from the processor 190.

The processor 190 of the present disclosure is a processing device including a storage device in which a control program is stored and a CPU configured to execute the control program. The processor 190 is specially configured or programmed to execute various kinds of processing included in the present disclosure. The processor 190 controls the entire gas laser apparatus 100. The processor 190 is electrically connected to a non-illustrated exposure processor of the exposure apparatus 200 and transmits and receives various signals to and from the exposure processor.

2.2 Operation

Operation of the processor 190 of the gas laser apparatus 100 of the comparative example will be described below.

Figure 3:
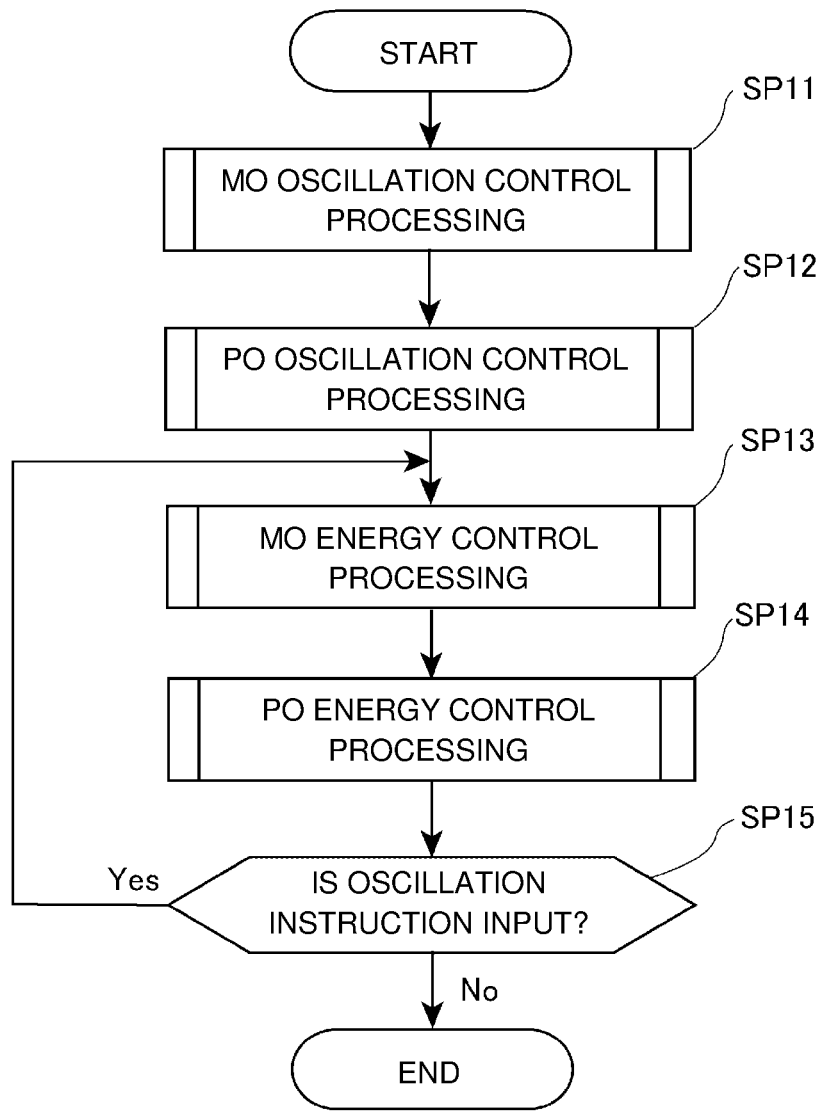
FIG. 3 is a diagram illustrating an example of a control flowchart of a processor of the comparative example.

FIG. 3 is a diagram illustrating an example of a control flowchart of the processor 190 of the comparative example. As illustrated in FIG. 3, a control process of the present embodiment includes steps SP11 to SP15. In a start state illustrated in FIG. 3, the processor 190 receives an oscillation instruction signal for the laser oscillator 130 and the amplifier 160 from the exposure processor of the exposure apparatus 200.

(Step SP11)

At the present step, the processor 190 transitions to oscillation control processing of the laser oscillator 130 to be described later. In the following description, the processing is referred to as MO oscillation control processing in some cases. When the MO oscillation control processing ends, the processor 190 advances the control process to step SP12.

(Step SP12)

At the present step, the processor 190 transitions to oscillation control processing of the amplifier 160 to be described later. In the following description, this processing is referred to as PO oscillation control processing in some cases. When the PO oscillation control processing ends, the processor 190 advances the control process to step SP13. The processor 190 may execute the control process in the order of steps SP12 and SP11 or may simultaneously execute steps SP11 and SP12.

(Step SP13)

At the present step, the processor 190 transitions to energy control processing of the laser oscillator 130 to be described later. In the following description, this processing is referred to as MO energy control processing in some cases. When the MO energy control processing ends, the processor 190 advances the control process to step SP14.

(Step SP14)

At the present step, the processor 190 transitions to energy control processing of the amplifier 160 to be described later. In the following description, this processing is referred to as PO energy control processing in some cases. When the PO energy control processing ends, the processor 190 advances the control process to step SP15. The processor 190 may simultaneously execute steps SP13 and SP14.

(Step SP15)

At the present step, when a next oscillation instruction signal is input from the exposure processor of the exposure apparatus 200, the processor 190 returns the control process to step SP13. When no next oscillation instruction signal is input from the exposure processor, the processor 190 controls the laser oscillator 130 and the amplifier 160 to stop voltage application and ends the control process. The next oscillation instruction signal is the next signal of the oscillation instruction signal received in the start state.

Figure 4:
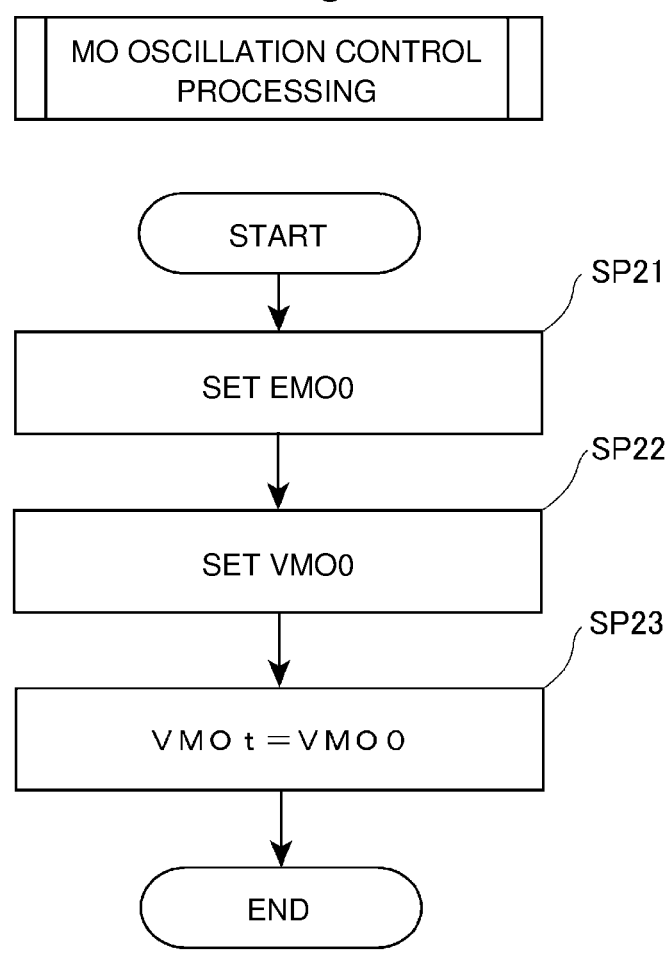
FIG. 4 is a control flowchart of the processor in an MO oscillation control processing illustrated in FIG. 3.

FIG. 4 is a control flowchart of the processor 190 in the MO oscillation control processing at step SP11. As illustrated in FIG. 4, the control flowchart includes steps SP21 to SP23.

(Step SP21)

At the present step, the processor 190 sets an initial value EMO0 of the pulse energy of a pulse laser beam to be output from the laser oscillator 130. In the following description, the beam is referred to as MO injection light in some cases. After setting the initial value EMO0, the processor 190 advances the control process to step SP22.

(Step SP22)

At the present step, the processor 190 sets an initial value VMO0 of voltage VMO applied to the electrodes 32*a* and 32*b* of the laser oscillator 130 so that the MO injection light having pulse energy of the initial value EMO0 is to be output from the laser oscillator 130. After setting the initial value VMO0, the processor 190 advances the control process to step SP23.

(Step SP23)

At the present step, the processor 190 sets, to the initial value VMO0, a target value VMOt of the voltage VMO applied to the electrodes 32*a* and 32*b* of the laser oscillator 130. After setting the target value VMOt, the processor 190 ends the control process in the MO oscillation control processing and advances the control process to step SP12.

Figure 5:
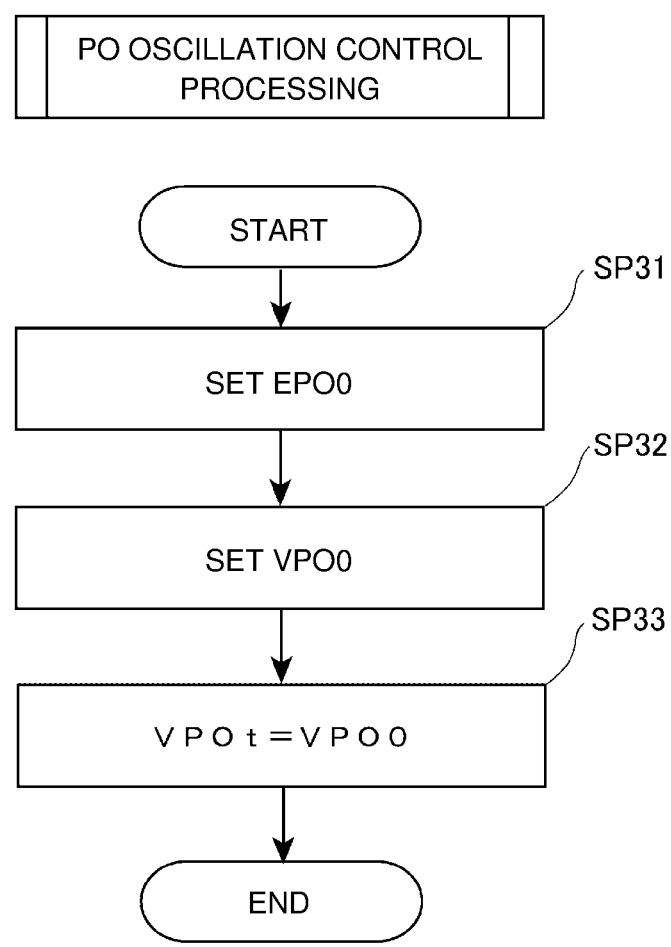
FIG. 5 is a control flowchart of the processor in PO oscillation control processing illustrated in FIG. 3.

FIG. 5 is a control flowchart of the processor 190 in the PO oscillation control processing at step SP12. As illustrated in FIG. 5, the control flowchart includes steps SP31 to SP33. The PO oscillation control processing is setting processing on the amplifier 160 side to perform setting of the initial value EMO0 at step SP21, the initial value VMO0 at step SP22, and the target value VMOt at step SP23 in the MO oscillation control processing. Each step will be briefly described below.

(Steps SP31, SP32, and SP33)

At step SP31, the processor 190 sets an initial value EPO0 of the pulse energy of a pulse laser beam to be output from the amplifier 160. In the following description, the beam is referred to as an amplified laser beam in some cases. At step SP32, the processor 190 sets an initial value VPO0 of voltage VPO applied to the electrodes 32*a* and 32*b* of the amplifier 160 so that the amplified laser beam having pulse energy of the initial value EPO0 is to be output from the amplifier 160. At step SP33, the processor 190 sets, to the initial value VPO0, a target value VPOt of the voltage VPO applied to the electrodes 32*a* and 32*b* of the amplifier 160.

After setting the target value VPOt, the processor 190 ends the control process in the PO oscillation control processing and advances the control process to step SP13.

Figure 6:
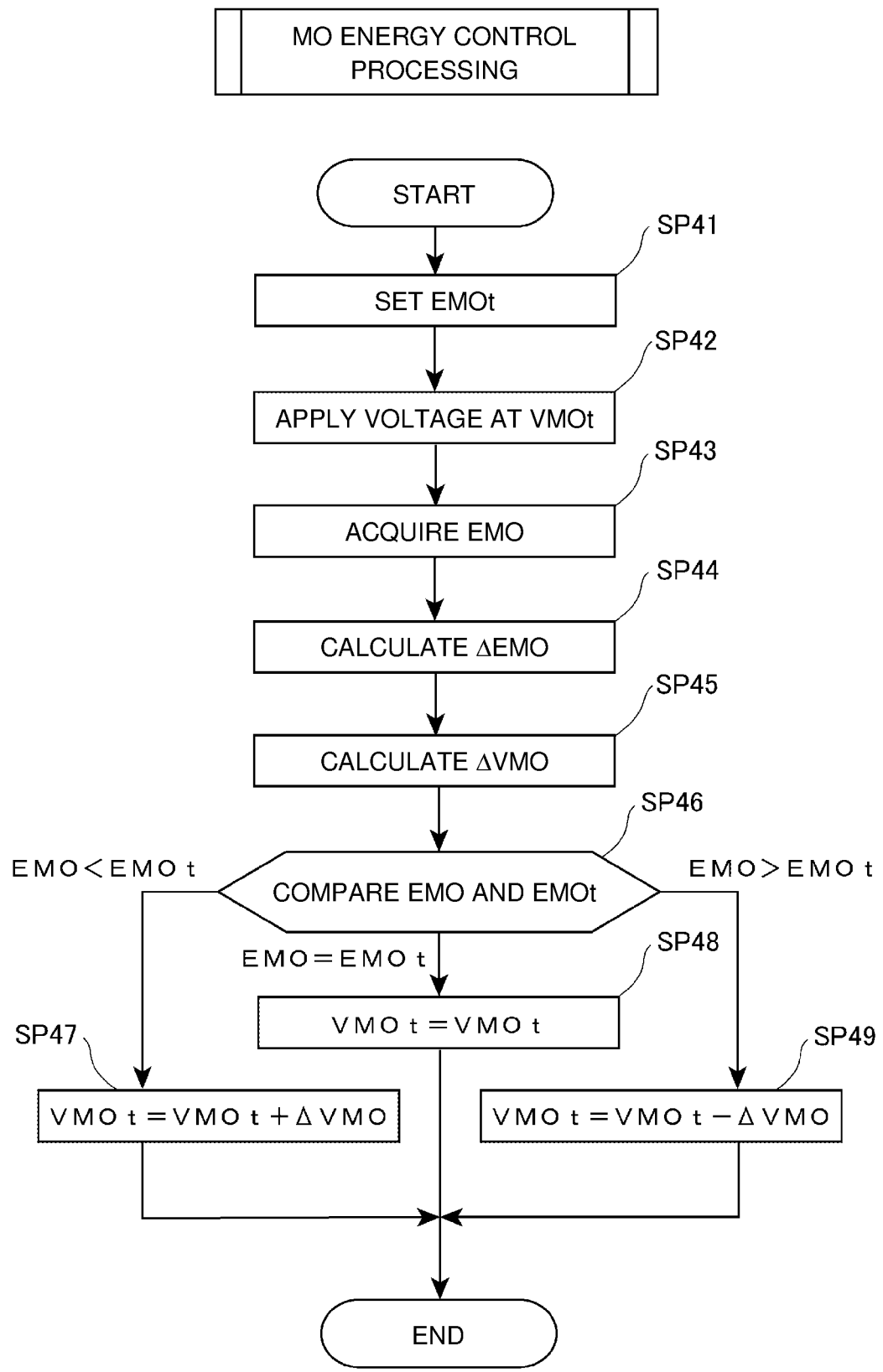
FIG. 6 is a control flowchart of the processor in an MO energy control processing illustrated in FIG. 3.

FIG. 6 is a control flowchart of the processor 190 in the MO energy control processing at step SP13. As illustrated in FIG. 6, the control flowchart includes steps SP41 to SP49.

(Step SP41)

At the present step, the processor 190 sets a target value EMOt of the pulse energy of the MO injection light to be output from the laser oscillator 130. After setting the target value EMOt, the processor 190 advances the control process to step SP42.

(Step SP42)

At the present step, the processor 190 turns on the switch in the pulse power module 43 of the laser oscillator 130. After turning on the switch, the processor 190 controls the pulse power module 43 so that the MO injection light having pulse energy of the target value EMOt is to be output from the laser oscillator 130. Specifically, the processor 190 controls the pulse power module 43 so that the voltage VMO at the target value VMOt set at step SP23 is to be applied to the electrodes 32*a* and 32*b*. The target value VMOt is set based on the target value EMOt. After applying the voltage VMO at the target value VMOt, the processor 190 advances the control process to step SP43.

When the voltage VMO at the target value VMOt is applied, insulation between the electrodes 32*a* and 32*b* breaks down and discharge occurs. The laser medium contained in the laser gas between the electrodes 32*a* and 32*b* is excited with energy of the discharge and discharges spontaneously emitted light when returning to the ground state. A part of the light is ultraviolet light and transmits through the window 31*b*. The transmitting light is enlarged in the traveling direction of the light when transmitting through the prism 61. In addition, the light is subjected to wavelength dispersion when transmitting through the prism 61, and is guided to the grating 63. The light is incident on the grating 63 at a predetermined angle and diffracted, and light having a predetermined wavelength is reflected by the grating 63 at a reflection angle equal to the incident angle. The light reflected by the grating 63 travels through the prism 61 and propagates to the internal space of the housing 30 through the window 31*b* again. The light propagating to the internal space of the housing 30 is line-narrowed. The line-narrowed light causes stimulated emission of the laser medium being excited, and accordingly, the light is amplified. The light proceeds to the output coupling mirror 70 through the window 31*a*. A part of the light transmits through the output coupling mirror 70, and a remaining part of the light is reflected by the output coupling mirror 70 and propagates to the internal space of the housing 30 through the window 31*a*. The light having propagated to the internal space of the housing 30 travels to the grating 63 through the window 31*b* and the prism 61 as described above. In this manner, the light having the predetermined wavelength reciprocates between the grating 63 and the output coupling mirror 70. The light is amplified each time the light passes through a discharge space in the internal space of the housing 30, and accordingly, laser oscillation occurs. Then, a part of the laser beam is output from the housing 30 through the output coupling mirror 70 as the MO injection light that is a pulse laser beam, is reflected by the high reflectance mirror 141b, and travels to the beam splitter 151b.

A part of the MO injection light having travelled to the beam splitter 151b transmits through the beam splitter 151b, is reflected by the high reflectance mirror 141c, and travels to the rear mirror 171. The part of the MO injection light traveling to the rear mirror 171 transmits through the rear mirror 171 and the window 31b of the amplifier 160 and travels into the housing 30. Another part of the MO injection light having travelled to the beam splitter 151b is reflected by the beam splitter 151b and travels to the optical sensor 151c.

The optical sensor 151c measures an actual value EMO of the pulse energy of a pulse laser beam including the MO injection light. The optical sensor 151c outputs a signal indicating the actual value EMO to the processor 190.
(Step SP43)

At the present step, the processor 190 acquires the actual value EMO based on the signal from the optical sensor 151c. After acquiring the actual value EMO, the processor 190 advances the control process to step SP44.
(Step SP44)

At the present step, the processor 190 calculates a control amount ΔEMO that is the difference between the target value EMOt and the actual value EMO of pulse energy. After calculating the control amount ΔEMO, the processor 190 advances the control process to step SP45.
(Step SP45)

At the present step, the processor 190 calculates a control amount ΔVMO of the voltage VMO based on the control amount ΔEMO. After calculating the control amount ΔVMO, the processor 190 advances the control process to step SP46.
(Step SP46)

At the present step, when the actual value EMO is smaller than the target value EMOt, the processor 190 advances the control process to step SP47. When the actual value EMO is equal to the target value EMOt, the processor 190 advances the control process to step SP48. When the actual value EMO is larger than the target value EMOt, the processor 190 advances the control process to step SP49.
(Steps SP47, SP48, and SP49)

At step SP47, the processor 190 sets a new target value VMOt of the voltage VMO to a value obtained by adding the control amount ΔVMO to the target value VMOt at step SP23. At step SP48, the processor 190 sets a new target value VMOt of the voltage VMO to the target value VMOt at step SP23. At step SP49, the processor 190 sets a new target value VMOt of the voltage VMO to a value obtained by subtracting the control amount ΔVMO from the target value VMOt at step SP23.

After setting the new target value VMOt at step SP47, SP48, or SP49, the processor 190 ends the control process in the MO energy control processing and advances the control process to step SP14. A case in which the control process advances in the order of steps SP14, SP15, SP13, and SP14 will be described below. In this case, the processor 190 controls the pulse power module 43 so that the voltage VMO at the new target value VMOt set at step SP47, SP48, or SP49 is applied to the electrodes 32a and 32b at step SP42. Thus, the processor 190 controls the voltage VMO applied to the electrodes 32a and 32b based on the actual value EMO.

Figure 7:
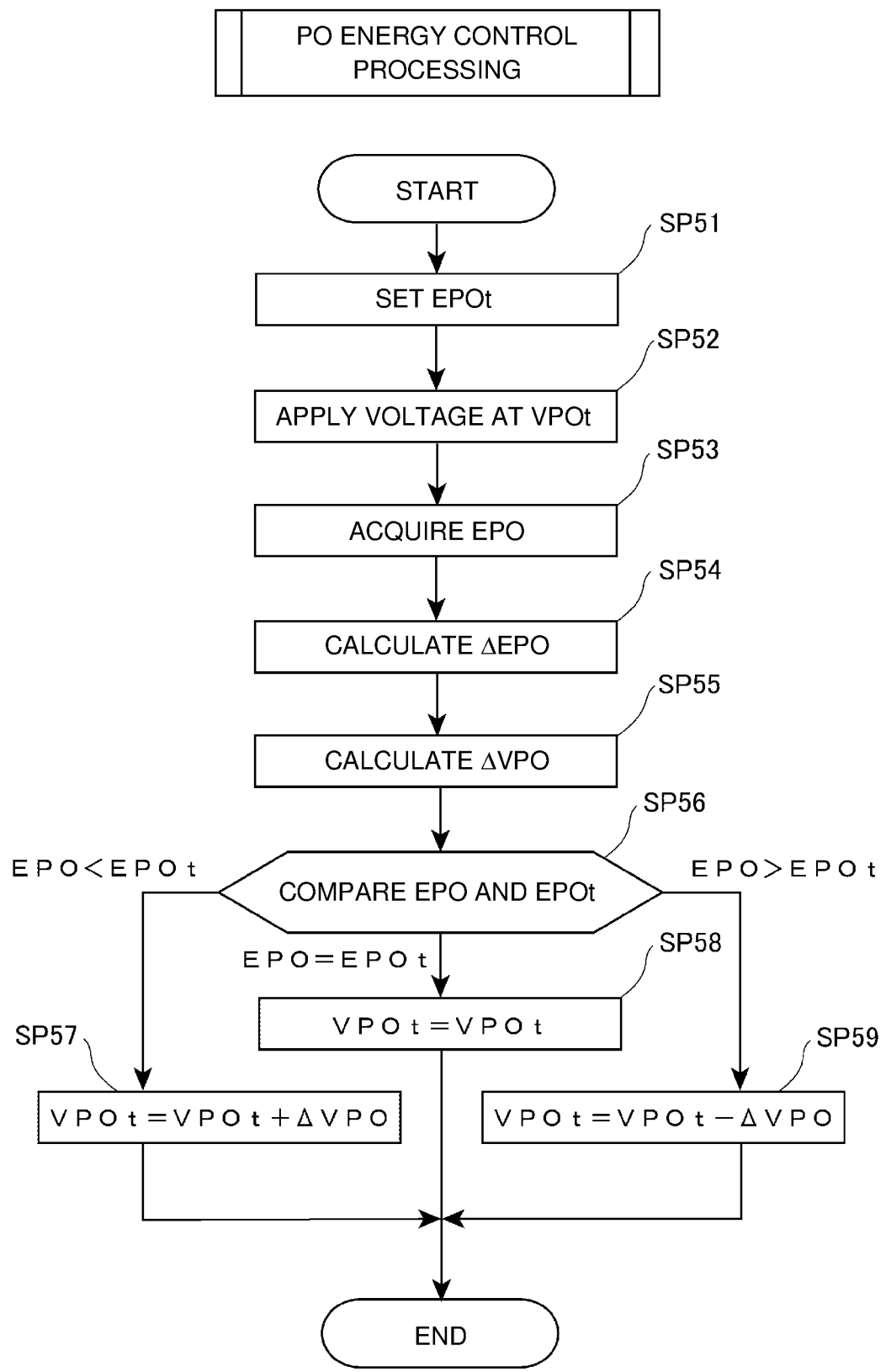
FIG. 7 is a control flowchart of the processor in PO energy control processing illustrated in FIG. 3.

FIG. 7 is a control flowchart of the processor 190 in the PO energy control processing at step SP14. As illustrated in FIG. 7, the control flowchart includes steps SP51 to SP59. The PO energy control processing is control processing on the amplifier 160 side to perform control at steps SP41 to SP49 in the MO energy control processing. In a start state of the PO energy control processing, a part of a pulse laser beam that is the MO injection light reflected by the high reflectance mirror 141c transmits through the rear mirror 171 and the window 31b and travels to the internal space of the housing 30 of the amplifier 160.
(Step SP51)

At the present step, the processor 190 sets a target value EPOt of the pulse energy of the amplified laser beam to be output from the amplifier 160.
(Step SP52)

At the present step, the processor 190 turns on a switch in the pulse power module 43 of the amplifier 160 so that discharge occurs when the MO injection light from the laser oscillator 130 travels to the discharge space in the housing 30. After turning on the switch, the processor 190 controls the pulse power module 43 so that the amplified laser beam having pulse energy of the target value EPOt is to be output from the laser oscillator 130. Specifically, the processor 190 controls the pulse power module 43 so that the voltage VPO at the target value VPOt at step SP33 is applied to the electrodes 32a and 32b. The target value VPOt is set based on the target value EPOt.

When the voltage VPO at the target value VPOt is applied, the MO injection light having entered the amplifier 160 is subjected to amplified oscillation in the amplifier 160. The MO injection light having propagated to the internal space of the housing 30 of the amplifier 160 travels to the rear mirror 171 and the output coupling mirror 170 through the windows 31a and 31b as described above. In this manner, light having a predetermined wavelength reciprocates between the rear mirror 171 and the output coupling mirror 70. The light is amplified each time the light passes through the discharge space in the internal space of the housing 30, and accordingly, laser oscillation occurs and a part of the light becomes an amplified laser beam.

The part of the amplified laser beam from the amplifier 160 transmits through the output coupling mirror 170, is reflected by the high reflectance mirrors 143b and 143c, and travels to the beam splitter 153b.

A part of the amplified laser beam traveling to the beam splitter 153b travels to the exposure apparatus 200 through the beam splitter 153b and the output window 173, and another part thereof is reflected by the beam splitter 153b and travels to the optical sensor 153c.

The optical sensor 153c measures an actual value EPO of the pulse energy of the amplified laser beam. The optical sensor 153c outputs a signal indicating the actual value EPO to the processor 190.
(Steps SP53, SP54, and SP55)

At step SP53, the processor 190 acquires the actual value EPO based on the signal from the optical sensor 153c. At step SP54, the processor 190 calculates a control amount ΔEPO that is the difference between the target value EPOt and the actual value EPO of pulse energy. At step SP55, the processor 190 calculates a control amount ΔVPO of the voltage VMO based on the control amount ΔEPO.
(Step SP56)

At the present step, when the actual value EPO is smaller than the target value EPOt, the processor 190 advances the control process to step SP57. When the actual value EPO is equal to the target value EPOt, the processor 190 advances the control process to step SP58. When the actual value EPO is larger than the target value EPOt, the processor 190 advances the control process to step SP59.

(Steps SP57, SP58, and SP59)

At step SP57, the processor 190 sets a new target value VPOt of the voltage VPO to a value obtained by adding the control amount ΔVPO to the target value VPOt at step SP33. At step SP58, the processor 190 sets a new target value VPOt of the voltage VPO to the target value VPOt at step SP33. At step SP59, the processor 190 sets a new target value VPOt of the voltage VPO to a value obtained by subtracting the control amount ΔVPO from the target value VPOt at step SP33.

After setting the new target value VPOt at step SP57, SP58, or SP59, the processor 190 ends the control process in the PO energy control processing and advances the control process to step SP15. A case in which the control process advances in the order of steps SP15, SP13, and SP14 will be described below. In this case, the processor 190 controls the pulse power module 43 so that the voltage VPO at the new target value VPOt set at step SP57, SP58, or SP59 is applied to the electrodes 32a and 32b at step SP52. Thus, the processor 190 controls the voltage VPO to be applied to the electrodes 32a and 32b based on the actual value EPO.

2.3 Problem

The gas laser apparatus 100 of the comparative example is an MOPA laser apparatus configured to amplify, through the amplifier 160, light output from the laser oscillator 130 and to output the light to the exposure apparatus 200. In such a gas laser apparatus 100, the laser oscillator 130 and the amplifier 160 are each independently controlled so that the actual value EPO of the pulse energy of the amplified laser beam traveling from the amplifier 160 to the exposure apparatus 200 falls within a predetermined range. In the following description, such control is referred to as a constant exposure amount control mode in some cases.

In addition, in the laser oscillator 130, the target value VMOt of the voltage VMO is controlled so that the actual value EMO of the pulse energy of the MO injection light falls within a predetermined range. In the amplifier 160 as well, the target value VPOt of the voltage VPO is controlled so that the actual value EPO of the pulse energy of the amplified laser beam falls within a predetermined range. In the following description, such control is referred to as an output variation control mode in some cases.

The following problem occurs when the constant exposure amount control mode is executed in the output variation control mode.

A part of the MO injection light traveling from the laser oscillator 130 to the rear mirror 171 is reflected by the rear mirror 171. This light is referred to as MO return light in some cases. A part of the amplified laser beam amplified by the amplifier 160 transmits through the rear mirror 171. This light is referred to as PO transmission light in some cases. Light from the rear mirror 171 as the MO return light and the PO transmission light is reflected by the high reflectance mirror 141c, transmits through the beam splitter 151b, is reflected by the high reflectance mirror 141b, and travels to the output coupling mirror 70. A part of the light traveling to the output coupling mirror 70 transmits through the output coupling mirror 70 and the window 31b of the laser oscillator 130 and travels into the housing 30. The light having travelled into the housing 30 reciprocates between the output coupling mirror 70 and the grating 63 as described above, transmits through the output coupling mirror 70 again, is reflected by the high reflectance mirror 141b, and travels to the beam splitter 151b again. Another part of the light traveling to the output coupling mirror 70 is reflected by the output coupling mirror 70 and the high reflectance mirror 141b and travels to the beam splitter 151b again as described above. A part of the light traveling to the beam splitter 151b again is reflected by the beam splitter 151b and travels to the optical sensor 151c again. Another part of the light traveling to the beam splitter 151b again transmits through the beam splitter 151b and travels to the rear mirror 171 again through the high reflectance mirror 141c. A part of this light transmits through the rear mirror 171 and travels to the output coupling mirror 170 again, and another part thereof is reflected by the rear mirror 171 and returns to the output coupling mirror 70 again.

When the actual value EPO of the pulse energy of the amplified laser beam becomes smaller than the target value EPOt, the processor 190 adds the control amount ΔVPO to the voltage VPO of the pulse power module 43 of the amplifier 160 so that the pulse energy increases. Accordingly, the pulse energy of the PO transmission light increases.

As described above, the PO transmission light is reflected by the beam splitter 151b and travels to the optical sensor 151c. When the PO transmission light travels to the optical sensor 151c, the optical sensor 151c measures the actual value EMO of the pulse energy of a pulse laser beam including the PO transmission light as well as the MO injection light and the MO return light traveling to the optical sensor 151c. This actual value EMO is larger than the actual value EMO before the control amount ΔVPO is added to the voltage VPO. When the actual value EMO increases, the actual value EMO becomes larger than the target value EMOt in some cases. In such a case, the processor 190 subtracts the control amount ΔVMO from the target value VMOt of the voltage VMO of the pulse power module 43 of the laser oscillator 130 so that the pulse energy of the MO injection light decreases.

Figure 8:
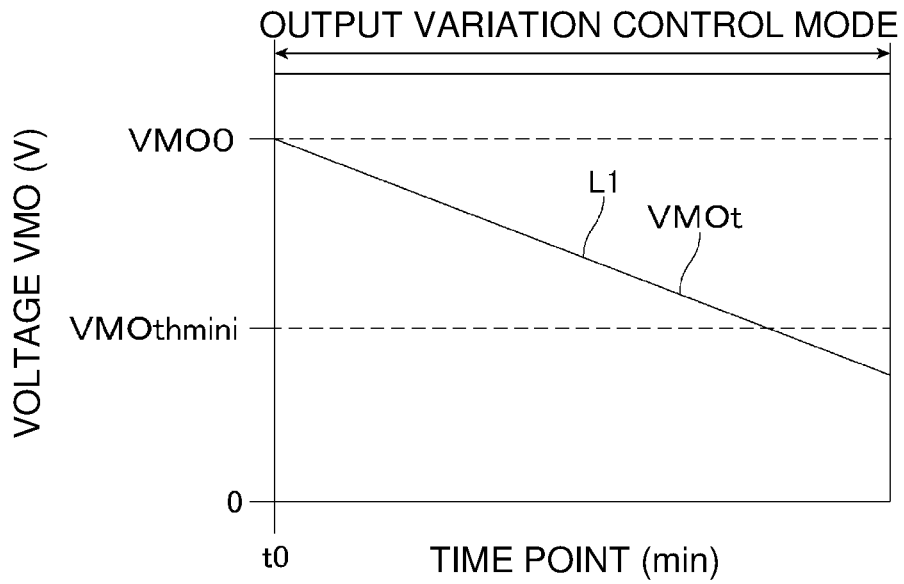
FIG. 8 is a diagram illustrating the relation between voltage of a pulse power module of a laser oscillator in the comparative example and a time point at which the voltage changes.

The concept of the above-described operation of the processor 190 is illustrated in FIG. 8, which is a diagram illustrating the relation between the voltage VMO of the pulse power module 43 of the laser oscillator 130 in the comparative example and a time point at which the voltage VMO changes. A solid line L1 illustrated in FIG. 8 represents the status of change of the target value VMOt. A threshold VMOthmini of the voltage VMO is substantially 70% of the initial value VMO0. As the operation is repeated, the target value VMOt gradually decreases from the initial value VMO0 by the control amount ΔVMO, and accordingly, the amount of the MO injection light output from the laser oscillator 130 gradually decreases. When the target value VMOt further decreases beyond the threshold VMOthmini of the voltage VMO, the amount of the MO injection light becomes unstable, and wavelength control and line width control by the line narrowing module 60 become unstable. When the amount of the MO injection light becomes unstable, the pulse energy of the amplified laser beam becomes unstable as well. Such instability leads to a concern that performance of the amplified laser beam does not meet a request by the exposure apparatus 200 and reliability of the gas laser apparatus 100 degrades.

A chamber device CH with which reliability of the gas laser apparatus 100 can be prevented from degrading are exemplarily presented in embodiments described below.

3. Gas Laser Apparatus of Embodiment 1

The gas laser apparatus 100 of an embodiment will be described below. Any component identical to a component described above is denoted by the same reference sign, and duplicate description thereof is omitted unless otherwise stated.

3.1 Configuration

The gas laser apparatus 100 of the present embodiment has the same configuration as the gas laser apparatus 100 of the comparative example, and thus description thereof is omitted.

3.2 Operation

Figure 9:
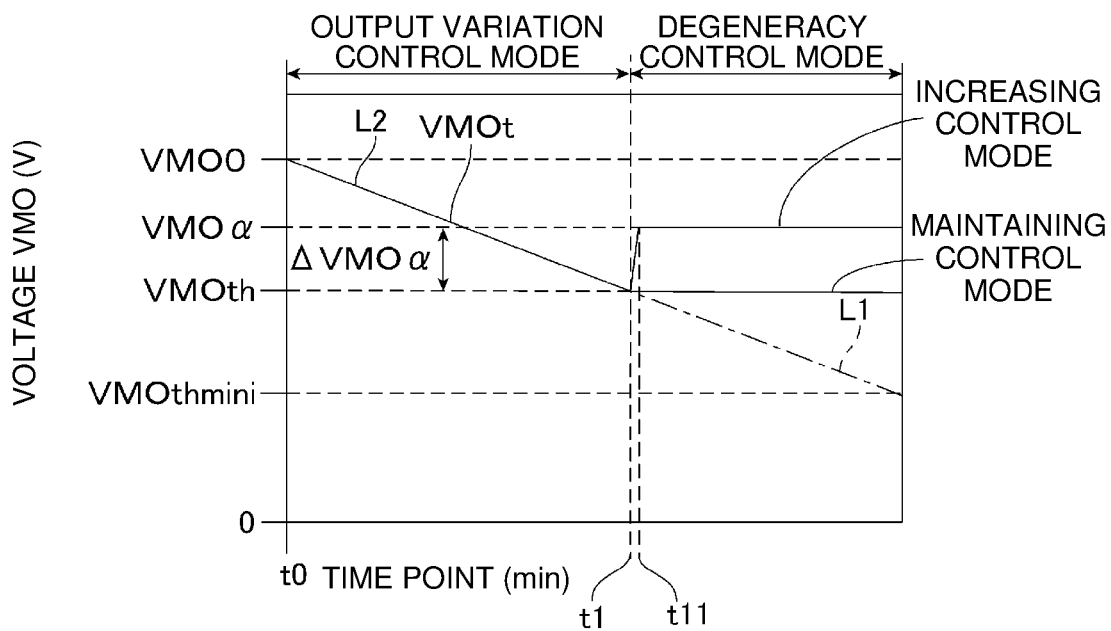
FIG. 9 is a diagram illustrating the relation between voltage of a pulse power module of a laser oscillator in Embodiment 1 and a time point at which the voltage changes.

FIG. 9 is a diagram illustrating the relation, in the present embodiment, between the voltage VMO of the pulse power module 43 of the laser oscillator 130 and a time point at which the voltage VMO changes. A solid line L2 illustrated in FIG. 9 represents the status of change of the target value VMOt. For comparison between the present embodiment and the comparative example, change of the target value VMOt illustrated with the solid line L1 in FIG. 8 is illustrated with a dashed and single-dotted line L1 in FIG. 9.

Operation of the present embodiment is different from operation of the comparative example in that the processor 190 causes a control mode of the voltage VMO to transition to a degeneracy control mode when the target value VMOt of the voltage VMO is smaller than a threshold VMOth. The threshold VMOth is larger than the threshold VMOthmini and smaller than the initial value VMO0 and is set in advance and stored in the storage device of the processor 190. The threshold VMOth is set to be larger than the threshold VMOthmini so that the gas laser apparatus 100 does not operate with degraded reliability. The threshold VMOth may be set to a value in the range of 70% to 80% of the initial value VMO0. The degeneracy control mode is a control mode in which operation of the exposure apparatus 200 is continued even though the lifetime of the gas laser apparatus 100 is sacrificed and shortened from an assumed lifetime or the stability of a pulse laser beam output from the gas laser apparatus 100 degrades. In the degeneracy control mode of the present embodiment, when the target value VMOt is smaller than the threshold VMOth, the processor 190 maintains the target value VMOt at a constant value irrespective of the magnitude of the actual value EMO of the pulse energy of the pulse laser beam, which is measured by the optical sensor 151c. The constant value is equal to or larger than the threshold VMOth. The degeneracy control mode is, for example, an increasing control mode or a maintaining control mode. In the increasing control mode, the processor 190 increases the target value VMOt to a voltage VMOα that is a constant value larger than the threshold VMOth by an addition amount ΔVMOα, and maintains the target value VMOt at the voltage VMOα. In the maintaining control mode, the processor 190 maintains the target value VMOt at the constant threshold VMOth. Whether the increasing control mode or the maintaining control mode is to be performed in the degeneracy control mode is set in advance. In the degeneracy control mode, the processor 190 controls the laser oscillator 130 independently from the amplifier 160. The exposure apparatus 200 is driven for a predetermined duration in the degeneracy control mode as well.

Figure 10:
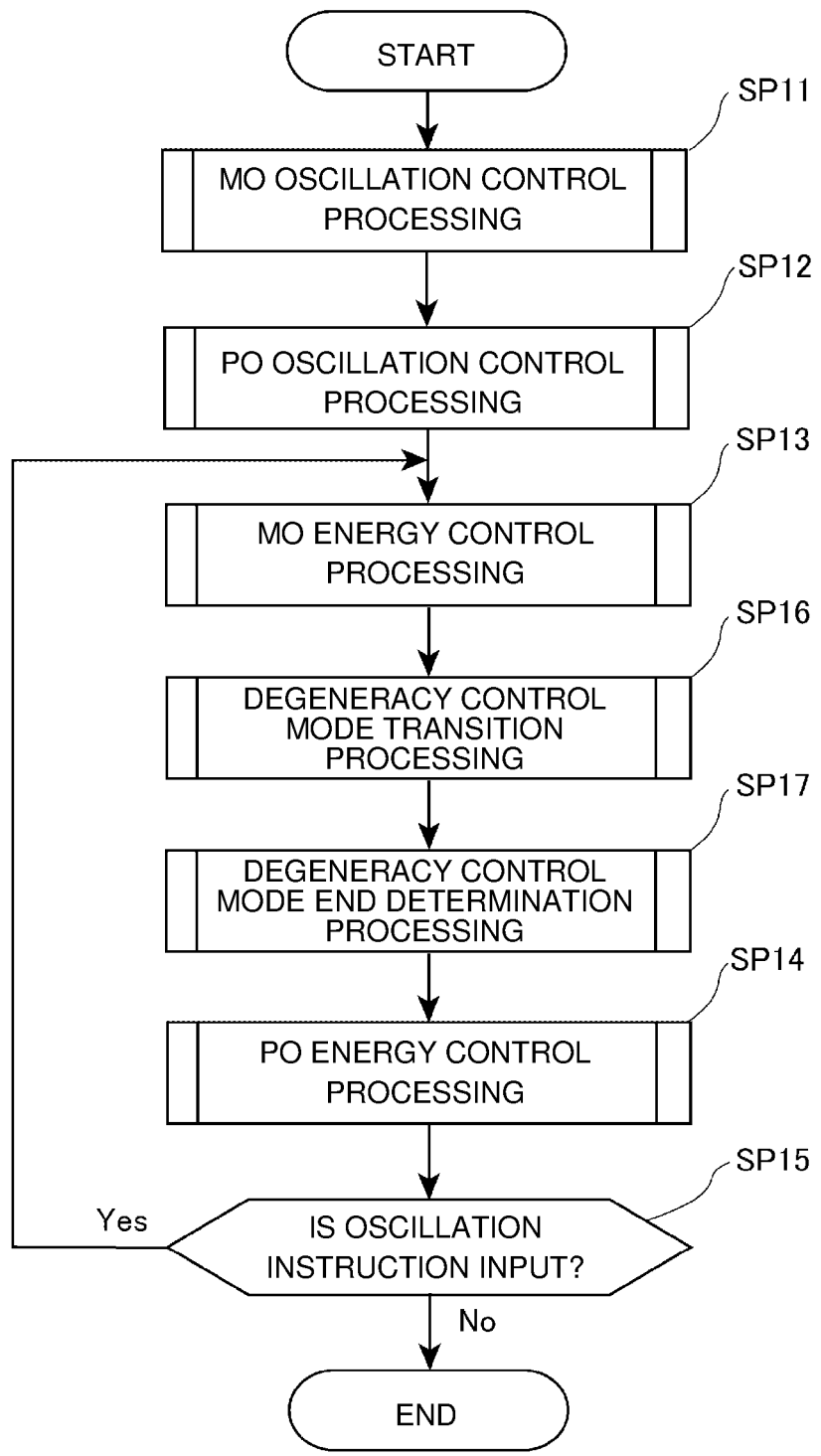
FIG. 10 is a diagram illustrating an example of a control flowchart of a processor of Embodiment 1.

FIG. 10 is a diagram illustrating an example of a control flowchart of the processor 190 of the present embodiment. As illustrated in FIG. 10, the control process of the present embodiment includes steps SP16 and SP17 between steps SP13 and SP14, which is the difference from the corresponding flowchart of the comparative example.

(Steps SP16 and SP17)

At step SP16, the processor 190 transitions to degeneracy control mode transition processing to be described later. When the degeneracy control mode transition processing ends, the processor 190 advances the control process to step SP17. At step SP17, the processor 190 transitions to degeneracy control mode end determination processing to be described later. When the degeneracy control mode end determination processing ends, the processor 190 advances the control process to step SP14.

The degeneracy control mode transition processing and the degeneracy control mode end determination processing are performed at the laser oscillator 130 but are not performed at the amplifier 160. This is because only the output variation control mode is performed at the amplifier 160.

In the control process of the present embodiment, the MO energy control processing at step SP13 is different from the MO energy control processing of the comparative example.

Figure 11:
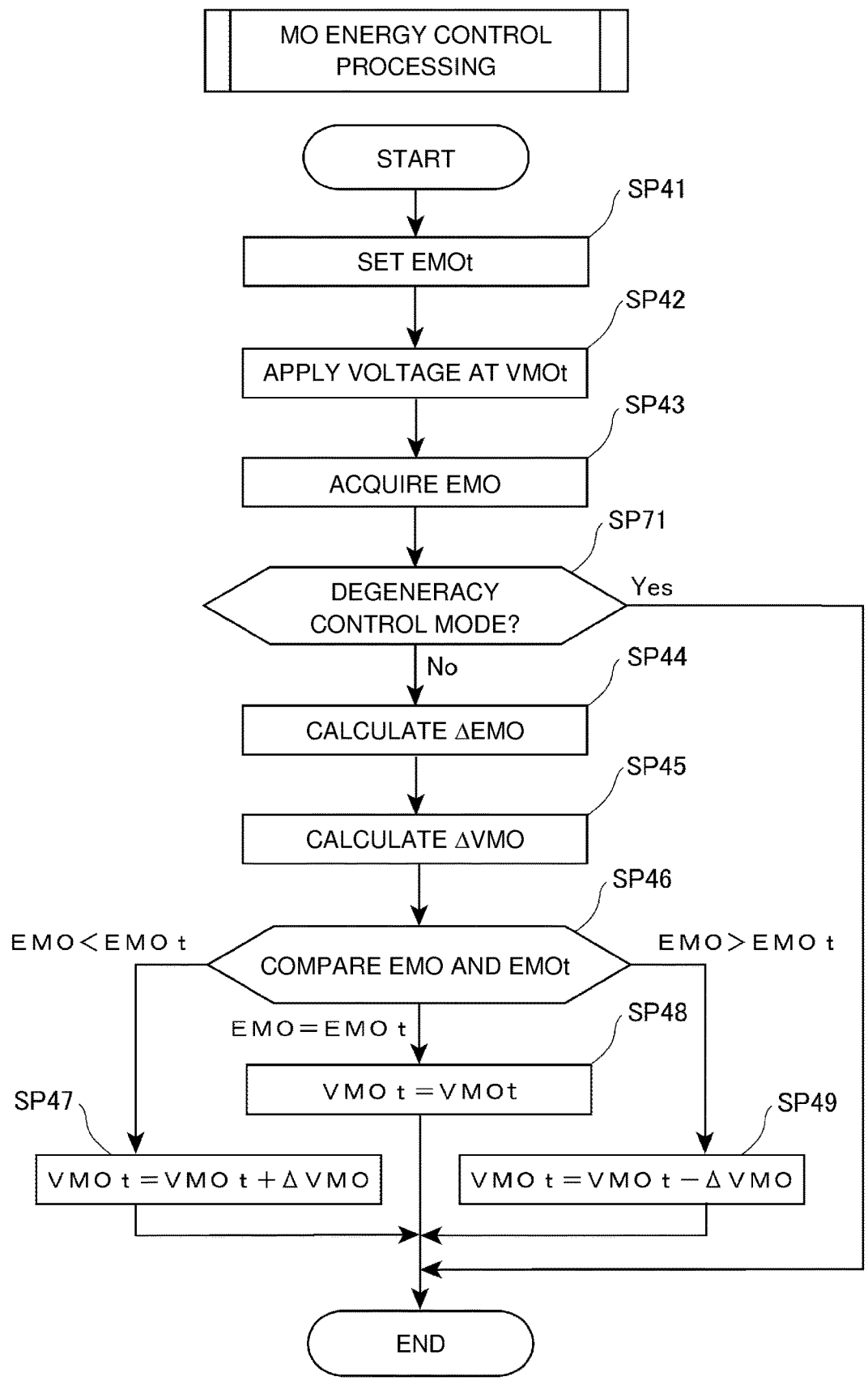
FIG. 11 is a control flowchart of the processor in MO oscillation control processing illustrated in FIG. 10.

FIG. 11 is a control flowchart of the processor 190 in the MO energy control processing at step SP13 of the present embodiment. The flowchart of the present embodiment includes step SP71 between steps SP43 and SP44, which is the difference from the corresponding flowchart of the comparative example.

(Step SP71)

At the present step, when the current control mode is not the degeneracy control mode, in other words, when the control mode is the output variation control mode, the processor 190 advances the control process to step SP44. When the current control mode is the degeneracy control mode, the processor 190 ends the control process in the MO energy control processing and advances the control process to step SP16. Description of determination of whether the current control mode is the degeneracy control mode is included in later description of step SP108 in the degeneracy control mode transition processing illustrated in FIGS. 12 and 13.

Figure 12:
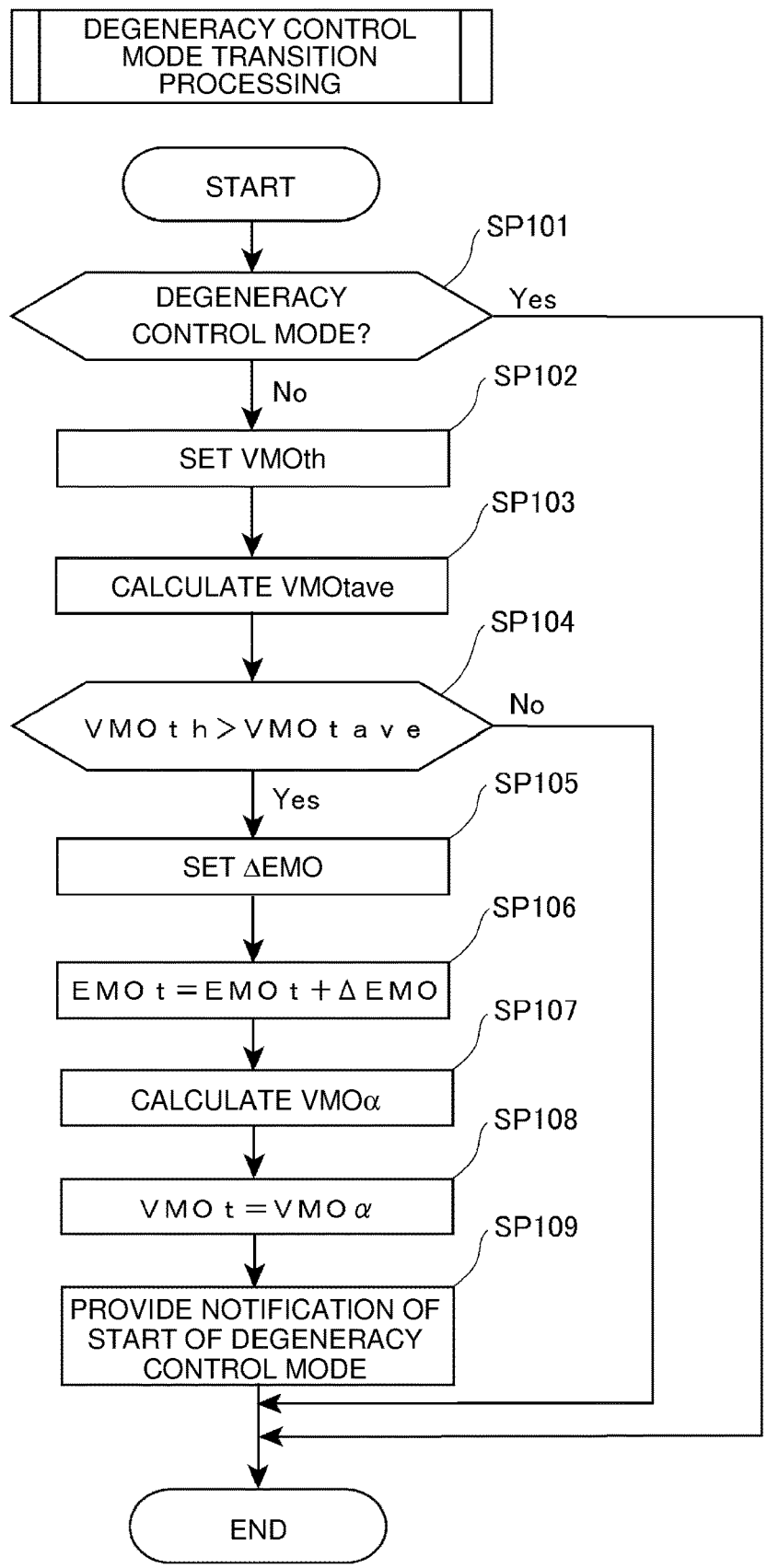
FIG. 12 is a control flowchart of the processor in an increasing control mode of degeneracy control mode transition processing illustrated in FIG. 10.

FIG. 12 is a control flowchart of the processor 190 in the increasing control mode of the degeneracy control mode transition processing at step SP16. As illustrated in FIG. 12, the control flowchart includes steps SP101 to SP109.

(Step SP101)

At the present step, when the control mode is the degeneracy control mode, the processor 190 ends the control process in the degeneracy control mode transition processing and advances the control process to step SP17. When the current control mode is not the degeneracy control mode, in other words, when the control mode is the output variation control mode, the processor 190 advances the control process to step SP102. Description of whether the current control mode is the degeneracy control mode is included in description of step SP108.

(Step SP102)

At the present step, the processor 190 sets the threshold VMOth. After setting the threshold VMOth, the processor 190 advances the control process to step SP103. The threshold VMOth may be defined based on a difference in the target value VMOt in a longer duration or may be defined based on a difference in the target value VMOt in accordance with the number of times of discharge.

(Step SP103)

At the present step, the processor 190 calculates a moving average value VMOtave of the target value VMOt. The moving average value VMOtave is the average value of the target value VMOt in a predetermined duration. The target value VMOt potentially varies to an unintended value due to disturbance, and thus the processor 190 calculates the moving average value VMOtave to reduce unintentional switching of the control mode to the degeneracy control mode based on the value. After calculating the moving average value VMOtave, the processor 190 advances the control process to step SP104.

(Step SP104)

At the present step, when the moving average value VMOtave is equal to or larger than the threshold VMOth, the control mode is the output variation control mode and thus the processor 190 ends the control process in the degeneracy control mode transition processing and advances the control process to step SP17. When the moving average value VMOtave is smaller than the threshold VMOth, the processor 190 causes the control mode to transition to the degeneracy control mode and advances the control process to step SP105.

(Step SP105)

At the present step, the processor 190 sets the control amount $\Delta EMO$ calculated at step SP44. After setting the control amount $\Delta EMO$, the processor 190 advances the control process to step SP106.

(Step SP106)

At the present step, the processor 190 resets the target value EMOt of pulse energy to a value obtained by adding the control amount $\Delta EMO$ to the target value EMOt at step SP41. After resetting the target value EMOt, the processor 190 advances the control process to step SP107.

(Step SP107)

At the present step, the processor 190 calculates the voltage VMOα based on the target value EMOt reset at step SP106. The voltage VMOα is smaller than the initial value VMO0. After calculating the voltage VMOα, the processor 190 advances the control process to step SP108.

(Step SP108)

At the present step, the processor 190 sets the target value VMOt of the voltage VMO to the constant voltage VMOα. After the voltage VMOα is set, the control mode is the degeneracy control mode and the processor 190 advances the control process to step SP109. The control process advances in the order of steps SP109, SP17, SP14, SP15, and SP13. In this case, at step SP42, the processor 190 controls the pulse power module 43 so that the voltage VMO at a new target value VMOt that is the voltage VMOα set at step SP108 is applied to the electrodes 32a and 32b. Thus, when the moving average value VMOtave is smaller than the threshold VMOth, the processor 190 maintains the voltage VMO at the constant voltage VMOα. When the control process further advances in the order of steps SP42, SP43, and SP71, the processor 190 ends the control process in the MO energy control processing since the control mode is the degeneracy control mode, and advances the control process to step SP16.

(Step SP109)

At the present step, the processor 190 outputs, to the display unit 180, a signal indicating start of maintaining the voltage VMO at the constant voltage VMOα, in other words, start of the degeneracy control mode, and the display unit 180 provides notification of start of the degeneracy control mode. The exposure apparatus 200 is kept driven irrespective of the notification by the display unit 180. After outputting the signal to the display unit 180, the processor 190 ends the control process in the increasing control mode of the degeneracy control mode transition processing and advances the control process to step SP17.

For example, a time point t1 illustrated in FIG. 9 is a time point at which the moving average value VMOtave is smaller than the threshold VMOth at step SP104. In this case, at step SP106, a new target value EMOt is set to a value obtained by adding a predetermined addition amount $\Delta EMO\alpha$ to the target value EMOt, and the target value VMOt at step SP108 is equal to the voltage VMOα obtained by adding the addition amount $\Delta VMO\alpha$ to the threshold VMOth. In FIG. 9, t11 denotes a time point at which the target value VMOt becomes equal to the voltage VMOα. The time point t1 is a time point at which the display unit 180 provides notification of start of the degeneracy control mode at step SP109.

Figure 13:
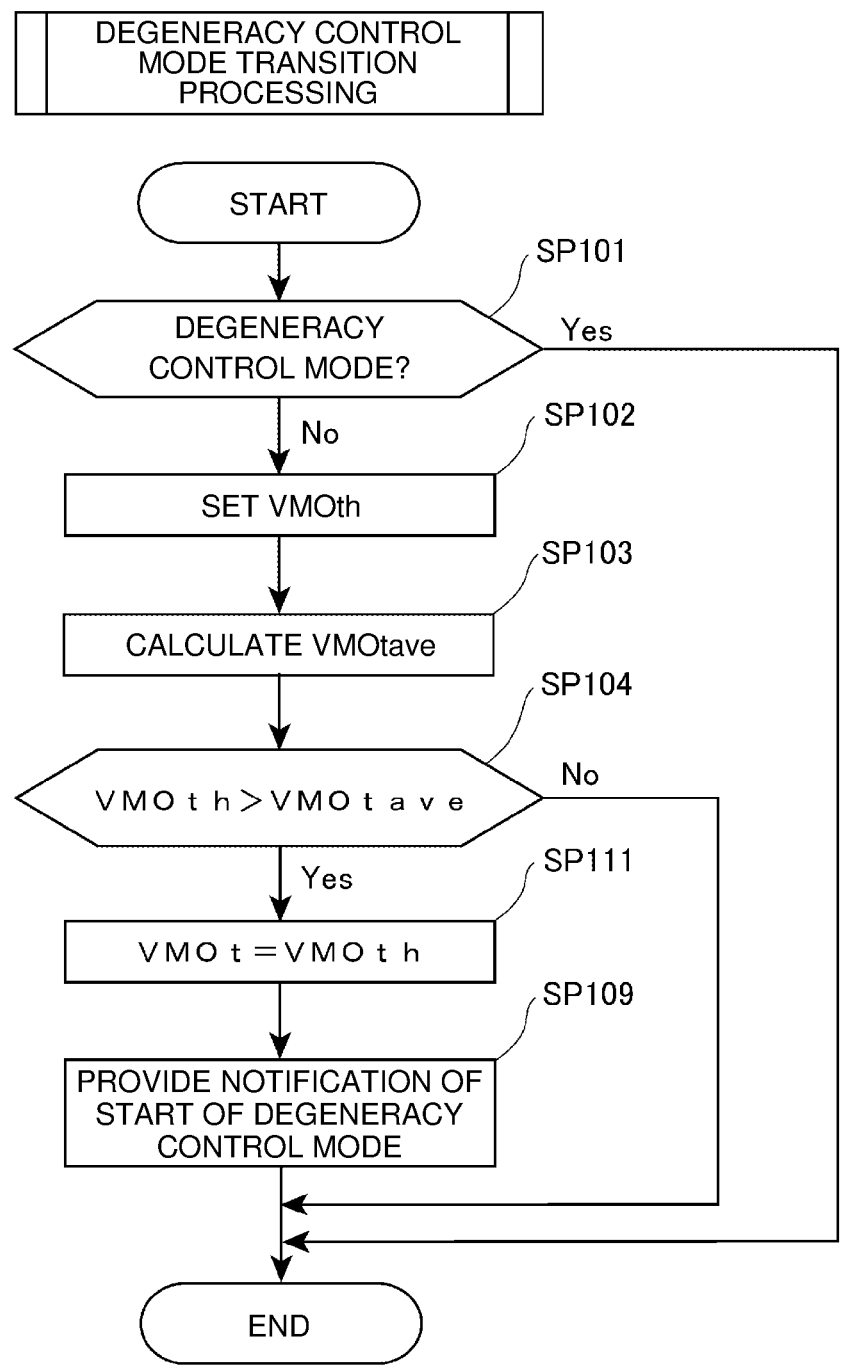
FIG. 13 is a control flowchart of the processor in a maintaining control mode of the degeneracy control mode transition processing illustrated in FIG. 10.

FIG. 13 is a control flowchart of the processor 190 in the maintaining control mode of the degeneracy control mode transition processing at step SP16. As illustrated in FIG. 13, this control flowchart includes step SP111 in place of steps SP105 to SP108, which is the difference from the increasing control mode described with reference to FIG. 12. At step SP104, when the moving average value VMOtave is smaller than the threshold VMOth, the processor 190 causes the control mode to transition to the degeneracy control mode and advances the control process to step SP111.

(Step SP111)

At the present step, the processor 190 sets the target value VMOt of the voltage VMO to the constant threshold VMOth. After the threshold VMOth is set, the control mode is the degeneracy control mode and the processor 190 advances the control process to step SP109. At step SP109 in the maintaining control mode, the processor 190 outputs, to the display unit 180, a signal indicating start of maintaining the voltage VMO at the constant threshold VMOth, and the display unit 180 provides notification of start of the degeneracy control mode. The control process advances in the order of steps SP109, SP17, SP14, SP15, and SP13. In this case, at step SP42, the processor 190 controls the pulse power module 43 so that the voltage VMO at a new target value VMOt that is the threshold VMOth set at step SP108 is applied to the electrodes 32a and 32b. Thus, when the moving average value VMOtave is smaller than the threshold VMOth, the processor 190 maintains the voltage VMO at the constant threshold VMOth.

Figure 14:
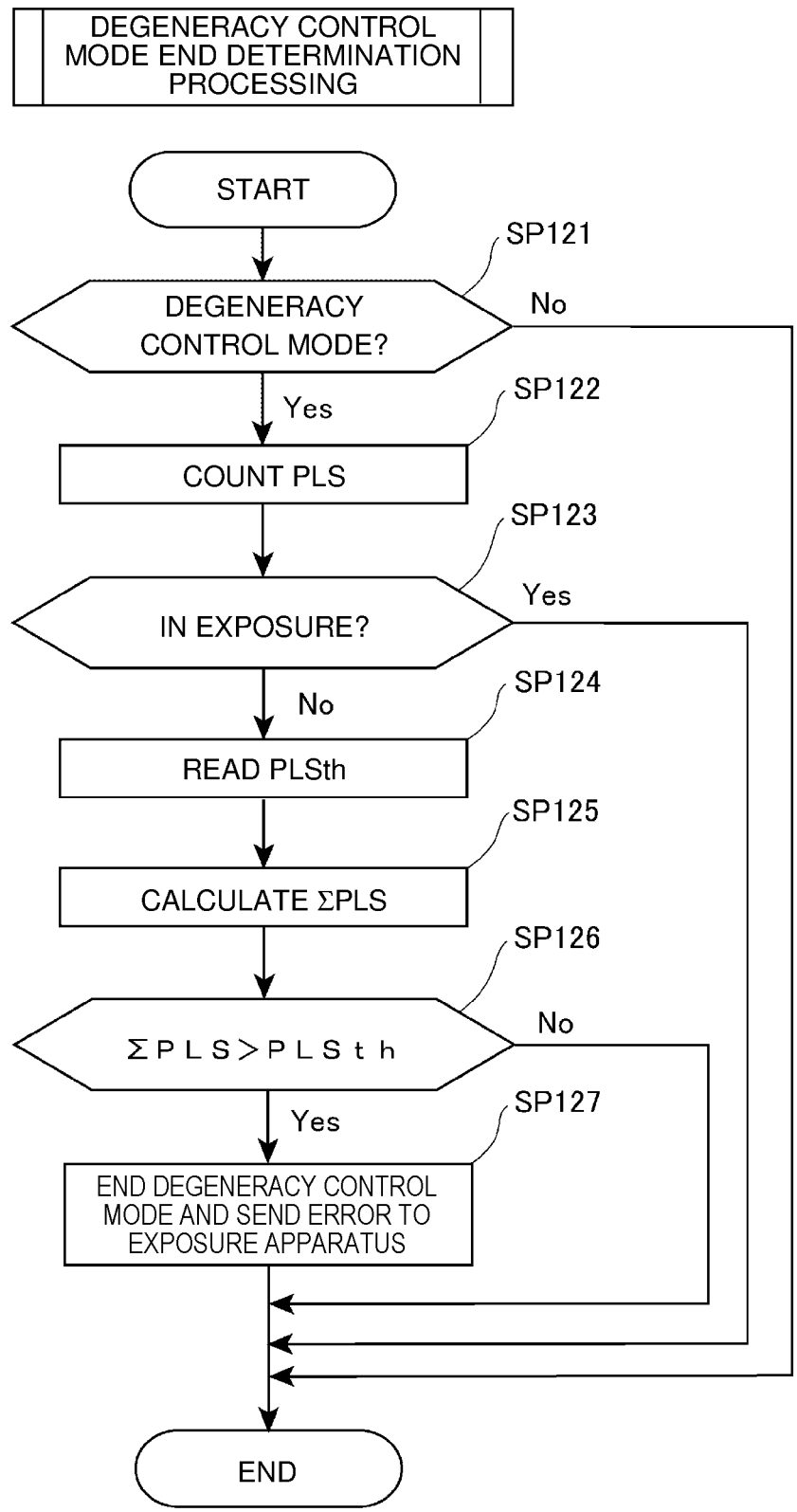
FIG. 14 is a control flowchart of the processor in degeneracy control mode end determination processing illustrated in FIG. 10.

FIG. 14 is a control flowchart of the processor 190 in the degeneracy control mode end determination processing at step SP17. As illustrated in FIG. 14, the control flowchart includes steps SP121 to SP127.

(Step SP121)

At the present step, when the control mode is not the degeneracy control mode, the processor 190 ends the control process in the degeneracy control mode end determination processing and advances the control process to step SP14. When the current control mode is the degeneracy control mode, the processor 190 advances the control process to step SP122.

(Step SP122)

At the present step, when a signal indicating a number PLS of pulses of the pulse laser beam is input from the optical sensor 151c, the processor 190 counts the pulse number PLS in the degeneracy control mode. The duration of the measurement may be a predetermined duration since start of the degeneracy control mode or may be a predetermined duration in the degeneracy control mode. After counting the pulse number PLS, the processor 190 advances the control process to step SP123.

(Step SP123)

At the present step, when a signal from the exposure apparatus 200 indicates that the exposure apparatus 200 is performing exposure, the processor 190 ends the control process in the degeneracy control mode end determination processing and advances the control process to step SP14. When the signal from the exposure apparatus 200 indicates that the exposure apparatus 200 is not performing exposure or when no signal is input from the exposure apparatus 200, the processor 190 advances the control process to step SP124. The processor 190 may advance the control process to step SP14 when the signal from the exposure apparatus 200 indicates adjustment of characteristics of the pulse laser beam output from the laser oscillator 130. The signal instructs, for example, adjustment of the supply amount of the laser gas from the non-illustrated laser gas supply device to the internal space of the housing 30.
(Step SP124)

At the present step, the processor 190 reads a pulse number threshold PLSth stored in the storage device of the processor 190 in advance. The pulse number threshold PLSth is a maximum allowable number of pulses with which operation of the gas laser apparatus 100 and the exposure apparatus 200 in the degeneracy control mode is possible. After reading the pulse number threshold PLSth, the processor 190 advances the control process to step SP125.
(Step SP125)

At the present step, the processor 190 calculates a cumulated value ΣPLS of the pulse number PLS counted at step SP122. After calculating the cumulated value ΣPLS, the processor 190 advances the control process to step SP126. The cumulated value ΣPLS may be a cumulated value in the predetermined duration described above for step SP122 or may be a cumulated value since start of the measurement.
(Step SP126)

At the present step, when the cumulated value ΣPLS is equal to or smaller than the pulse number threshold PLSth, the processor 190 ends the control process in the degeneracy control mode end determination processing and advances the control process to step SP14. When the cumulated value ΣPLS is larger than the pulse number threshold PLSth, the processor 190 advances the control process to step SP127.
(Step SP127)

At the present step, the processor 190 stops voltage application at the laser oscillator 130 to end the degeneracy control mode and stops voltage application at the amplifier 160. The processor 190 outputs a signal indicating error to the exposure apparatus 200. The error indicates, for example, operation stop or maintenance notification. The exposure apparatus 200 stops when the signal is input to the exposure apparatus 200. After stopping voltage application and outputting the signal indicating error to the exposure apparatus 200, the processor 190 ends the control process in the degeneracy control mode end determination processing and advances the control process to step SP14. After receiving the signal, the exposure apparatus 200 outputs no oscillation instruction signal to the gas laser apparatus 100. Thus, the processor 190 ends the control process when the control process proceeds to steps SP14 and SP15.

3.3 Effect

In the gas laser apparatus 100 of the present embodiment, the processor 190 maintains the target value VMOt of the voltage VMO at a constant value equal to or larger than the threshold VMOth when the target value VMOt of the voltage VMO at the laser oscillator 130 is smaller than the threshold VMOth. Accordingly, the target value VMOt of the voltage VMO is prevented from becoming smaller than the threshold VMOth when the PO transmission light from the amplifier 160 increases and the actual value EMO of the pulse energy of the pulse laser beam, which is detected by the optical sensor 151c, increases. When the target value VMOt of the voltage VMO is prevented from becoming smaller, the amount of the MO injection light can be prevented from becoming unstable. When the light amount is prevented from becoming unstable, the pulse energy of the amplified laser beam can be prevented from becoming unstable, the gas laser apparatus 100 can continuously operate at performance that meets a request by the exposure apparatus 200, and reliability of the gas laser apparatus 100 can be prevented from degrading.

In the gas laser apparatus 100 of the present embodiment, the constant value corresponds to the voltage VMOα larger than the threshold VMOth. In this case, the degeneracy control mode is the increasing control mode, the amount of the MO injection light output from the laser oscillator 130 can increase as compared to a case in the maintaining control mode, and the pulse energy of the amplified laser beam can be prevented from becoming unstable. Alternatively, the constant value is equal to the threshold VMOth. In this case, the degeneracy control mode is the maintaining control mode, and calculation of the addition amount ΔVMOα for increasing the threshold VMOth to the voltage VMOα in the increasing control mode can be unnecessary in the maintaining control mode. Thus, with the above-described configuration, a load on the processor 190 can be reduced as compared to a case in the increasing control mode.

In the gas laser apparatus 100 of the present embodiment, when the moving average value VMOtave is smaller than the threshold VMOth as described above for step SP104, the processor 190 sets the target value VMOt of the voltage VMO to a constant value as described above for steps SP108 and SP111. In addition, the processor 190 maintains, at the constant value, the voltage VMO applied at the target value VMOt to the electrodes 32a and 32b. The target value VMOt potentially varies to an unintended value due to disturbance. When the moving average value VMOtave is used as described above, unnecessary transition from the output variation control mode to the degeneracy control mode when the target value VMOt temporarily becomes smaller than the threshold VMOth due to disturbance can be prevented. The processor 190 does not necessarily need to use the moving average value VMOtave to maintain, at the constant value, the voltage VMO applied at the target value VMOt to the electrodes 32a and 32b when the target value VMOt is smaller than the threshold VMOth.

In the gas laser apparatus 100 of the present embodiment, when the moving average value VMOtave is smaller than the threshold VMOth, the display unit 180 provides notification of start of maintaining the target value VMOt of the voltage VMO at the constant voltage VMOα or threshold VMOth as described above for step SP109. Accordingly, a user of the gas laser apparatus 100 can know the start.

In the gas laser apparatus 100 of the present embodiment, the processor 190 stops application of the voltage VMO when the cumulated value ΣPLS of the number of pulses is larger than the pulse number threshold PLSth as described above for step SP127. In a case in which the exposure apparatus 200 stops simultaneously with start of the degeneracy control mode, the exposure apparatus 200 stops manufacturing halfway through completion of a workpiece such as a semiconductor wafer and thus the workpiece is wasted in some cases. With the above-described configuration, even after the degeneracy control mode is started, the exposure apparatus 200 can operate for a predetermined duration until the cumulated value ΣPLS becomes larger than the pulse number threshold PLSth. Thus, the exposure apparatus 200 can stop after completion of the workpiece, and accordingly, the workpiece can be prevented from being wasted.

In the gas laser apparatus 100 of the present embodiment, the processor 190 outputs a signal indicating error to the exposure apparatus 200 when the cumulated value ΣPLS of the number of pulses is larger than the pulse number threshold PLSth as described above for step SP127. The error indicates, for example, operation stop or maintenance notification. Accordingly, for example, the operation stop or maintenance notification can be provided to the exposure apparatus 200 side.

The beam splitter 151b only needs to be disposed on the optical path of the pulse laser beam output from the output coupling mirror 70. The detection unit 153 only needs to be disposed on the optical path of the pulse laser beam output from the output coupling mirror 170. Thus, the detection unit 153 may be disposed inside the exposure apparatus 200. For example, the detection unit 153 may be disposed between the projection optical system 220 and the workpiece table WT. In the degeneracy control mode end determination processing, the processor 190 may count the pulse number PLS in the degeneracy control mode based on a signal indicating the pulse number PLS from the optical sensor 153c. In the degeneracy control mode end determination processing, the processor 190 may output a signal indicating error to the exposure apparatus 200 based on the number of times that the control process transitions to the degeneracy control mode end determination processing since the degeneracy control mode is started. In the degeneracy control mode end determination processing, at step SP122, the processor 190 may count the number of times that the control process advances to step SP122, and may advance the control process to step SP127 when the number of times is larger than a threshold. The processor 190 may advance the control process to step SP14 when the number of times is equal to or smaller than the threshold. In the degeneracy control mode end determination processing, at step SP122, the processor 190 may measure a time since start of the degeneracy control mode and may advance the control process to step SP127 when the time is longer than a threshold. When the time is equal to or shorter than the threshold, the processor 190 may advance the control process to step SP14.

4. Gas Laser Apparatus of Embodiment 2

The gas laser apparatus 100 of Embodiment 2 will be described below. Any component identical to a component described above is denoted by the same reference sign, and duplicate description thereof is omitted unless otherwise stated.

4.1 Configuration

The gas laser apparatus 100 of the present embodiment has the same configuration as the gas laser apparatuses 100 of the comparative example and Embodiment 1, and thus description thereof is omitted.

4.2 Operation

Figure 15:
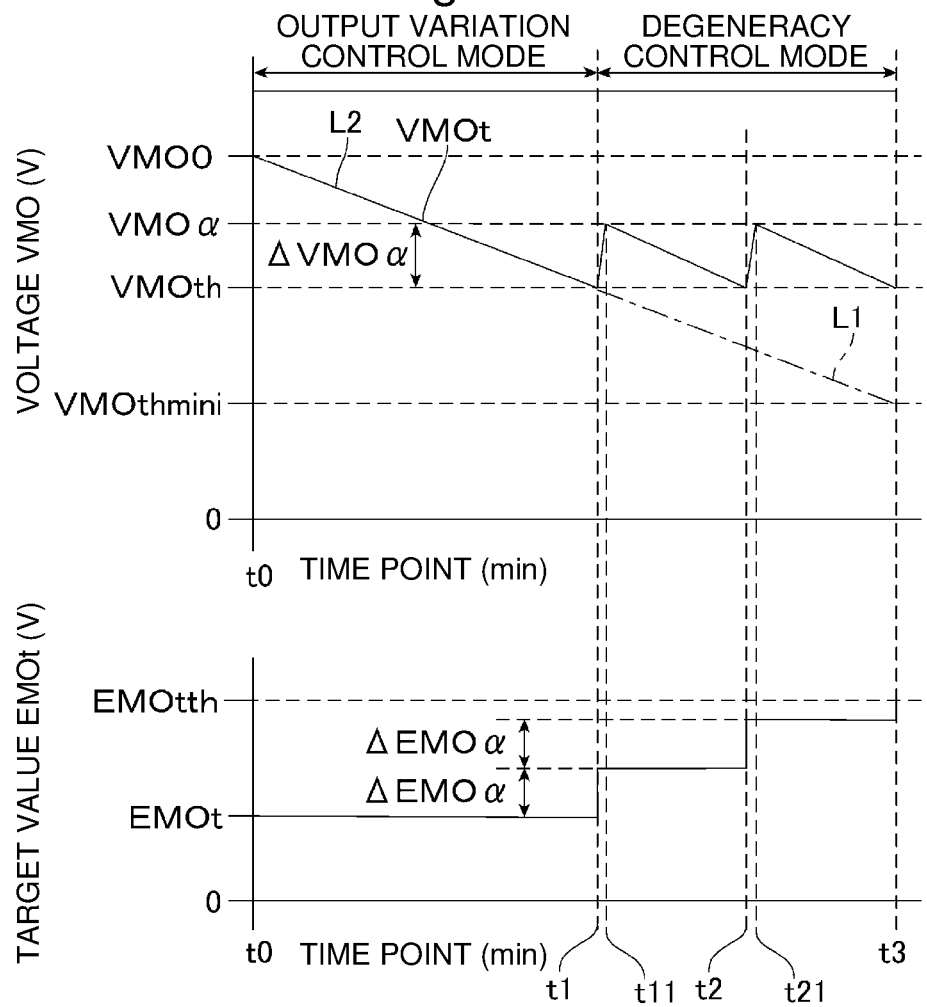
FIG. 15 is a diagram illustrating the relation between voltage of a pulse power module of a laser oscillator in Embodiment 2 and a time point at which the voltage changes.

FIG. 15 is a diagram illustrating the relation between the voltage VMO of the pulse power module 43 of the laser oscillator 130 in the present embodiment and a time point at which the voltage VMO changes, and the relation between the target value EMOt of pulse energy and a time point at which the target value EMOt changes.

The degeneracy control mode of the present embodiment is different from the degeneracy control mode of Embodiment 1 in that, even in the degeneracy control mode, the voltage VMO tends to gradually decrease by the control amount ΔVMO as in the output variation control mode. The degeneracy control mode of the present embodiment is different from the degeneracy control mode of Embodiment 1 in that the reference of determination to end the degeneracy control mode is based on the varying target value EMOt of pulse energy.

In the degeneracy control mode of the present embodiment, the processor 190 increases the target value VMOt to the voltage VMOα that is a predetermined value larger than the threshold VMOth by the addition amount ΔVMOα each time the moving average value VMOtave of the target value VMOt becomes smaller than the threshold VMOth. In addition, the processor 190 controls the pulse power module 43 so that the voltage VMOα is applied to the electrodes 32a and 32b. The processor 190 repeats the above-described setting and application.

In the determination to end the degeneracy control mode, the processor 190 determines whether to end the degeneracy control mode based on the pulse number PLS of the pulse laser beam in Embodiment 1. However, in the present embodiment, the processor 190 determines whether to end the degeneracy control mode with reference to an upper threshold EMOtth of the target value EMOt of pulse energy, which is separately set for the laser oscillator 130. In the present embodiment, the processor 190 sets a new target value EMOt obtained by adding the addition amount ΔEMOα to the target value EMOt each time the moving average value VMOtave of the target value VMOt becomes smaller than the threshold VMOth in the degeneracy control mode. Subsequently, the processor 190 ends the degeneracy control mode when the new target value EMOt exceeds the threshold EMOtth.

Figure 16:
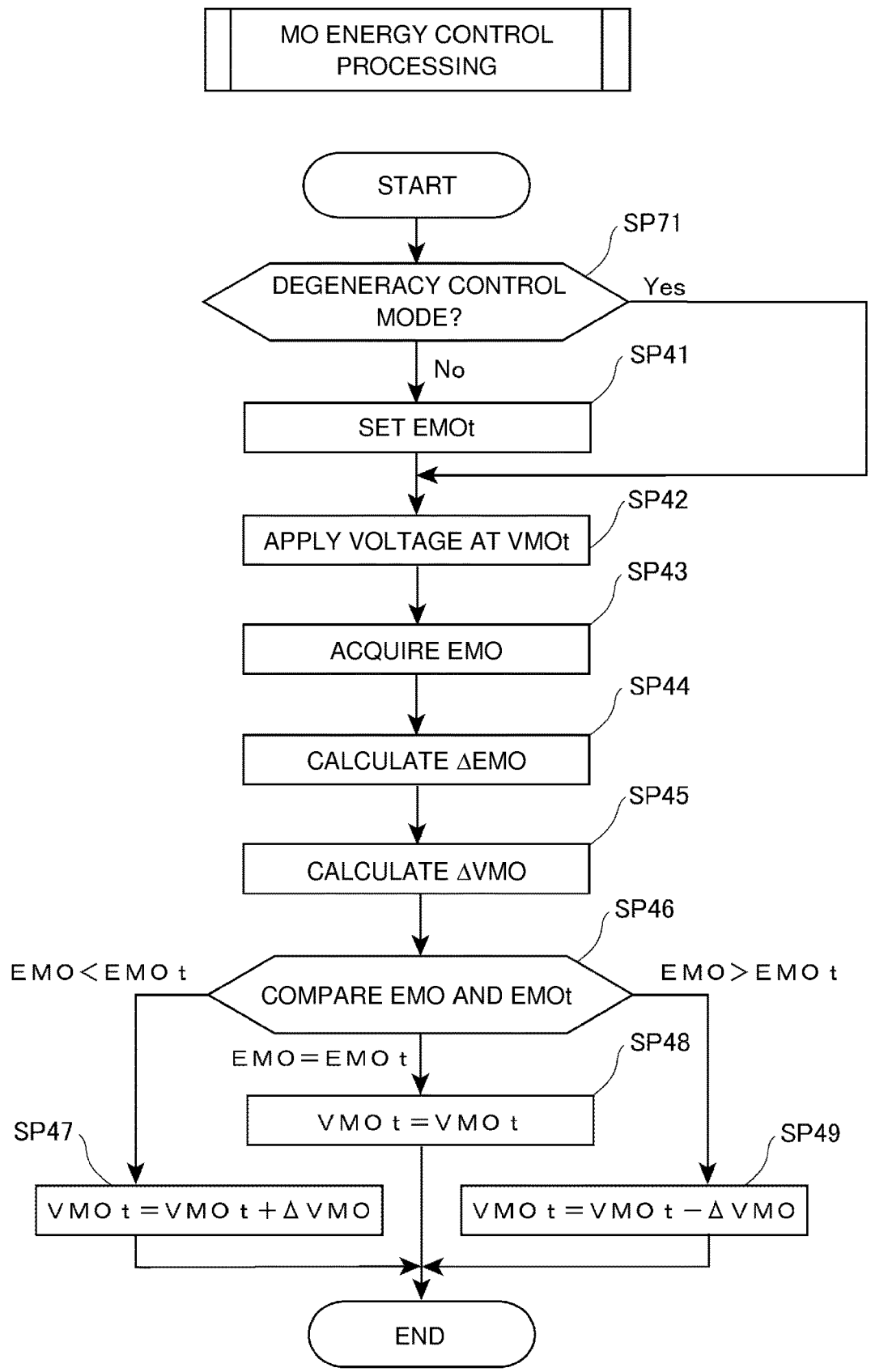
FIG. 16 is a control flowchart of the processor in oscillation control processing of Embodiment 2.

FIG. 16 is a control flowchart of the processor 190 in the MO energy control processing at step SP13 of the present embodiment. The flowchart of the present embodiment is different from the corresponding flowchart of the comparative example in that the position of step SP71 is changed to a position between the start state and step SP41.

(Step SP71)

At the present step, when the current control mode is not the degeneracy control mode, in other words, when the control mode is the output variation control mode, the processor 190 advances the control process to step SP41. When the current control mode is the degeneracy control mode, the processor 190 advances the control process to step SP42. In a case of the degeneracy control mode, a new target value EMOt is already set as described later for step SP133. Thus, in the degeneracy control mode, the processor 190 controls the pulse power module 43 so that the MO injection light having pulse energy of the target value EMOt is output. Specifically, the processor 190 controls the pulse power module 43 so that the voltage VMO at the target value VMOt set based on the target value EMOt is applied to the electrodes 32a and 32b of the laser oscillator 130 at step SP42.

Figure 17:
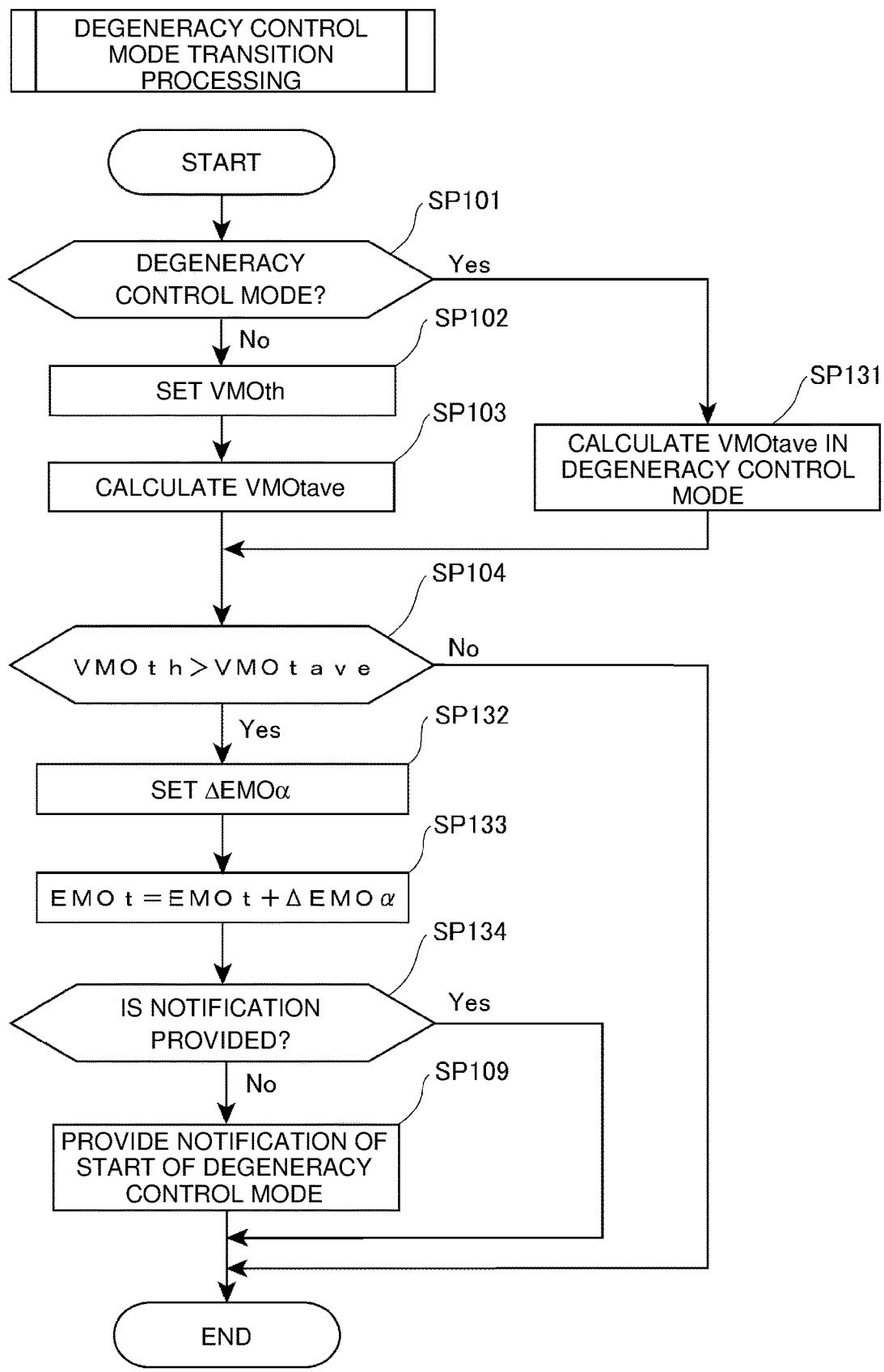
FIG. 17 is a control flowchart of the processor in degeneracy control mode transition processing of Embodiment 2.

FIG. 17 is a control flowchart of the processor 190 in the degeneracy control mode transition processing at step SP16 of the present embodiment. This control flowchart includes step SP131 and steps SP132 to SP134 in place of steps SP105 to SP108, which is the difference from the increasing control mode described above with reference to FIG. 12.

(Step SP101)

At the present step, when the current control mode is not the degeneracy control mode, the processor 190 advances the control process to step SP102. When the control mode is the degeneracy control mode, the processor 190 advances the control process to step SP131.

(Step SP131)

At the present step, the processor 190 calculates the moving average value VMOtave of the target value VMOt of the voltage VMO in the degeneracy control mode. The moving average value VMOtave at step SP104 is a value in the previous mode of the degeneracy control mode, that is, the output variation control mode, but the moving average value VMOtave at the present step is a value in the degeneracy control mode. The moving average value VMOtave at the present step is over, for example, 50 pulses to 200 pulses inclusive. The moving average value VMOtave is different from the moving average value VMOtave calculated at step SP103 in the output variation control mode. Thus, the processor 190 does not use, as an average value in the degeneracy control mode, the moving average value VMOtave calculated in the output variation control mode. After calculating the moving average value VMOtave, the processor 190 advances the control process to step SP104.
(Step SP104)

At step SP104, when the moving average value VMOtave is equal to or larger than the threshold VMOth, the processor 190 ends the control process in the degeneracy control mode transition processing and advances the control process to step SP17. When the moving average value VMOtave is smaller than the threshold VMOth, the processor 190 advances the control process to step SP132.
(Step SP132)

At the present step, the processor 190 sets the addition amount $\Delta EMO\alpha$ and advances the control process to step SP133. The addition amount $\Delta EMO\alpha$ is stored in the storage device of the processor 190 in advance.
(Step SP133)

At the present step, the processor 190 sets a new target value EMOt obtained by adding the addition amount $\Delta EMO\alpha$ to the target value EMOt. The new target value EMOt increases in a stepped manner each time the control process advances to step SP133. The processor 190 stores the set new target value EMOt in the storage device of the processor 190 and advances the control process to step SP134.

The control process advances in the order of steps SP17, SP14, SP15, and SP13 after the degeneracy control mode transition processing. In this case, the processor 190 controls the pulse power module 43 so that the voltage VMO at the target value VMOt set based on the new target value EMOt is applied to the electrodes 32a and 32b of the laser oscillator 130 at step SP42 as described above for step SP71. For example, time points t1, t2, and t3 illustrated in FIG. 15 are time points at which the moving average value VMOtave is smaller than the threshold VMOth at step SP104. In this case, at step SP133, the new target value EMOt is set to a value obtained by adding the addition amount $\Delta EMO\alpha$ to the target value EMOt, and the target value VMOt at step SP42 is equal to the voltage VMO$\alpha$ obtained by adding the addition amount $\Delta VMO\alpha$ to the threshold VMOth. In FIG. 15, t11 and t21 denote time points at which the target value VMOt becomes the voltage VMO$\alpha$. As in the output variation control mode, the pulse energy of the PO transmission light increases between the time points t11 and t2 and between the time points t21 and t3, and accordingly, the target value VMOt tends to gradually decrease by the control amount $\Delta VMO$. Thus, when the target value VMOt increased to the predetermined voltage VMO$\alpha$ is smaller than the threshold VMOth, the processor 190 increases the target value VMOt to the voltage VMO$\alpha$ again. Moreover, in the degeneracy control mode, the processor 190 increases the target value EMOt by the addition amount $\Delta EMO\alpha$ at step SP133 each time the moving average value VMOtave becomes smaller than the threshold VMOth.
(Step SP134)

At the present step, when a signal indicating start of the degeneracy control mode as described above for step SP109 is not output to the display unit 180, it means that notification of the degeneracy control mode is not provided, and the processor 190 advances the control process to step SP109. When the signal is output to the display unit 180 to provide notification of the degeneracy control mode, the processor 190 ends the control process in the degeneracy control mode transition processing and advances the control process to step SP17.

Figure 18:
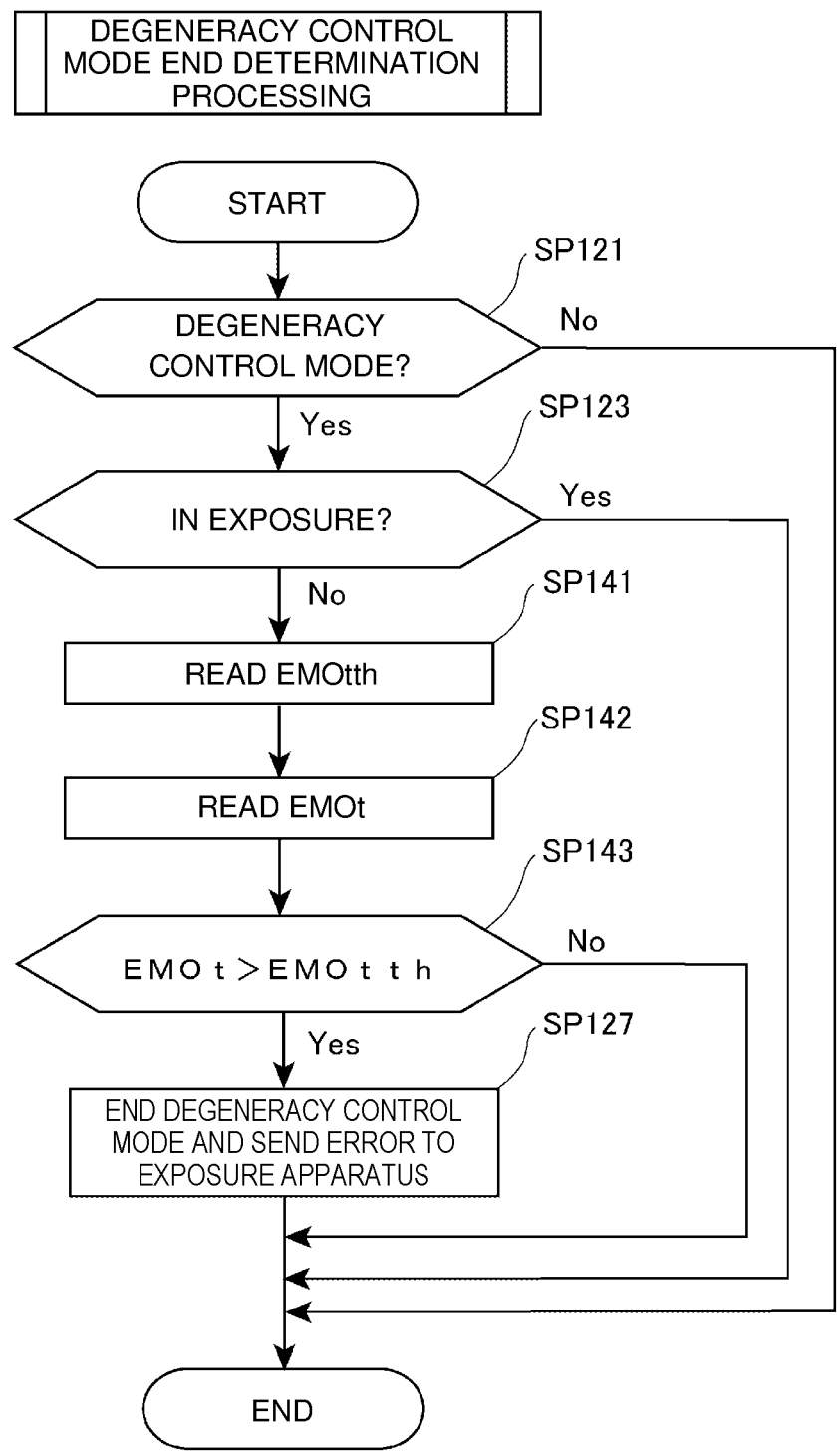
FIG. 18 is a control flowchart of the processor in degeneracy control mode end determination processing of Embodiment 2.

FIG. 18 is a control flowchart of the processor 190 in the degeneracy control mode end determination processing at step SP17 of the present embodiment. This control flowchart does not need step SP122 but includes steps SP141 to SP143 in place of steps SP124 to SP126, which is the difference from the degeneracy control mode end determination processing described above with reference to FIG. 14. The degeneracy control mode end determination processing of the present embodiment may be the degeneracy control mode end determination processing of Embodiment 1.
(Steps SP121 and SP123)

At step SP121, when the current control mode is the degeneracy control mode, the processor 190 advances the control process to step SP123. At step SP123, when the exposure apparatus 200 is performing exposure, the processor 190 advances the control process to step SP141.
(Step SP141)

At the present step, the processor 190 reads the threshold EMOtth stored in the storage device of the processor 190 in advance. The threshold EMOtth is a voltage value at which it is predicted that the pulse laser beam does not damage the line narrowing module 60. After reading the threshold EMOtth, the processor 190 advances the control process to step SP142.
(Step SP142)

At the present step, the processor 190 reads the target value EMOt of pulse energy stored in the storage device of the processor 190 at step SP133. After reading the target value EMOt, the processor 190 advances the control process to step SP143.
(Step SP143)

At the present step, when the target value EMOt is equal to or smaller than the threshold EMOtth, the processor 190 ends the control process in the degeneracy control mode end determination processing and advances the control process to step SP14. When the target value EMOt is larger than the threshold EMOtth, the processor 190 advances the control process to step SP127. At the present step, the processor 190 may end the control process and advance the control process to step SP14 when the number of times of addition of the addition amount $\Delta EMO\alpha$ at step SP133 is smaller than a predetermined number of times. The processor 190 may advance the control process to step SP127 when the addition number of times is equal to or larger than the predetermined number of times.

4.3 Effect

In the gas laser apparatus 100 of the present embodiment, when the target value VMOt of the voltage VMO at the laser oscillator 130 is smaller than the threshold VMOth, the processor 190 increases the target value VMOt of the voltage VMO to the predetermined voltage VMO$\alpha$ larger than the threshold VMOth. Accordingly, the voltage VMO can be prevented from becoming smaller than the threshold VMOth even when the PO transmission light from the amplifier 160 increases and the actual value EMO of the pulse energy of the pulse laser beam, which is detected by the optical sensor 151c, increases. When the voltage VMO is prevented from becoming smaller, the amount of the MO injection light can be prevented from becoming unstable. When the light amount is prevented from becoming unstable, the pulse energy of the amplified laser beam can be prevented from becoming unstable, the gas laser apparatus 100 can continuously operate at performance that meets a request by the exposure apparatus 200, and reliability of the gas laser apparatus 100 can be prevented from degrading.

In the gas laser apparatus 100 of the present embodiment, when the target value VMOt of the voltage VMO increased to the predetermined voltage VMOα is smaller than the threshold VMOth, the processor 190 increases the target value VMOt of the voltage VMO to the predetermined voltage VMOα again. After the voltage VMO is increased to the voltage VMOα, the pulse energy of the PO transmission light increases, the actual value EMO increases, and the target value VMOt of the voltage VMO becomes smaller than the threshold VMOth in some cases. With the above-described configuration, since the processor 190 increases the target value VMOt of the voltage VMO to the predetermined voltage VMOα again, the target value VMOt of the voltage VMO can be prevented from becoming smaller than the threshold VMOth. When the target value VMOt of the voltage VMO is prevented from becoming smaller, the amount of the MO injection light can be prevented from becoming unstable.

In the gas laser apparatus 100 of the present embodiment, the processor 190 increases the target value EMOt of pulse energy each time the target value VMOt of the voltage VMO increased to the voltage VMOα becomes smaller than the threshold VMOth. The processor 190 stops application of the voltage VMO when the target value EMOt is larger than the threshold Emotth. With the above-described configuration, even after the degeneracy control mode is started, the exposure apparatus 200 can operate for a predetermined duration until the target value EMOt becomes larger than the threshold Emotth. Thus, the exposure apparatus 200 can stop after completion of a workpiece, and accordingly, the workpiece can be prevented from being wasted.

In the gas laser apparatus 100 of the present embodiment, the processor 190 outputs a signal indicating error to the exposure apparatus 200 when the target value EMOt is larger than the threshold EMOtth as described above for steps SP143 and SP127. Accordingly, for example, operation stop or maintenance notification can be provided to the exposure apparatus 200 side.

5. Gas Laser Apparatus of Embodiment 3

The gas laser apparatus 100 of Embodiment 3 will be described below. Any component identical to a component described above is denoted by the same reference sign, and duplicate description thereof is omitted unless otherwise stated.

5.1 Configuration

The gas laser apparatus 100 of the present embodiment has the same configuration as the gas laser apparatuses 100 of the comparative example and Embodiments 1 and 2, and thus description thereof is omitted.

5.2 Operation

Figure 19:
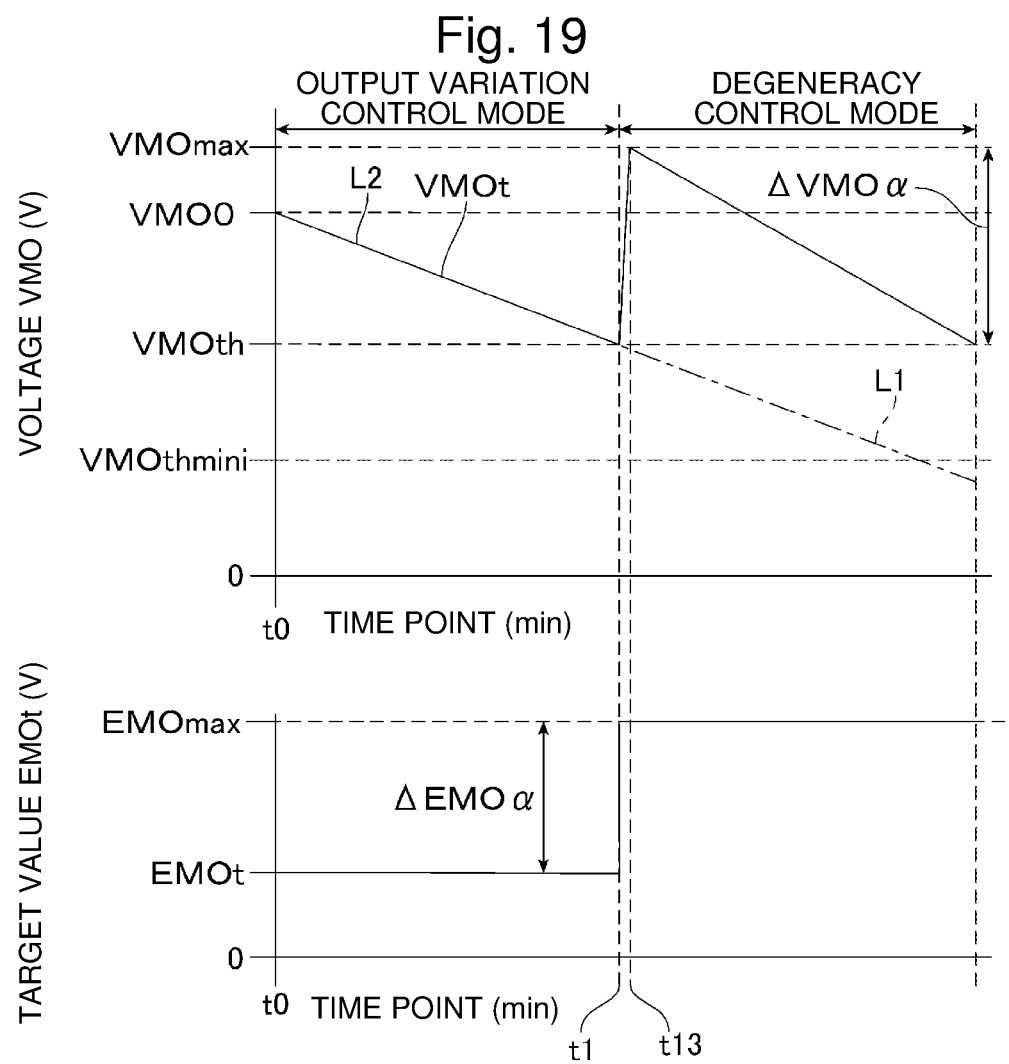
FIG. 19 is a diagram illustrating the relation between voltage of a pulse power module of a laser oscillator in Embodiment 3 and a time point at which the voltage changes.

FIG. 19 is a diagram illustrating the relation between the voltage VMO of the pulse power module 43 of the laser oscillator 130 in the present embodiment and a time point at which the voltage VMO changes, and the relation between the target value EMOt of pulse energy and a time point at which the target value EMOt changes.

In the degeneracy control mode of the present embodiment, the processor 190 sets the target value VMOt of the voltage VMO to a predetermined voltage VMOmax when the moving average value VMOtave is equal to or smaller than the threshold VMOth. The processor 190 controls the pulse power module 43 so that the voltage VMOα is applied to the electrodes 32a and 32b of the laser oscillator 130. The processor 190 performs the above-described setting and application only once, which is the difference from the degeneracy control mode of Embodiment 2 in which the setting and application are repeated. The voltage VMOmax is larger than the threshold VMOth by the addition amount ΔVMOα and larger than the initial value VMO0. The voltage VMOmax is a maximum voltage value at which it is predicted that the pulse laser beam does not damage the line narrowing module 60.

The reference of determination to end the degeneracy control mode of the present embodiment is based on the varying target value VMOt of the voltage VMO, which is the difference from the determination to end the degeneracy control mode of Embodiment 2. In the determination to end the degeneracy control mode, the processor 190 determines whether to end the degeneracy control mode based on the target value EMOt of pulse energy in Embodiment 2. However, in the present embodiment, the processor 190 ends the degeneracy control mode when the moving average value VMOtave of the voltage VMO in the degeneracy control mode becomes smaller than the threshold VMOth. This determination may be performed based on, in addition to the moving average value VMOtave of the voltage VMO, the number of pulses illustrated in FIG. 14 of Embodiment 1, time elapse, or combination thereof.

Figure 20:
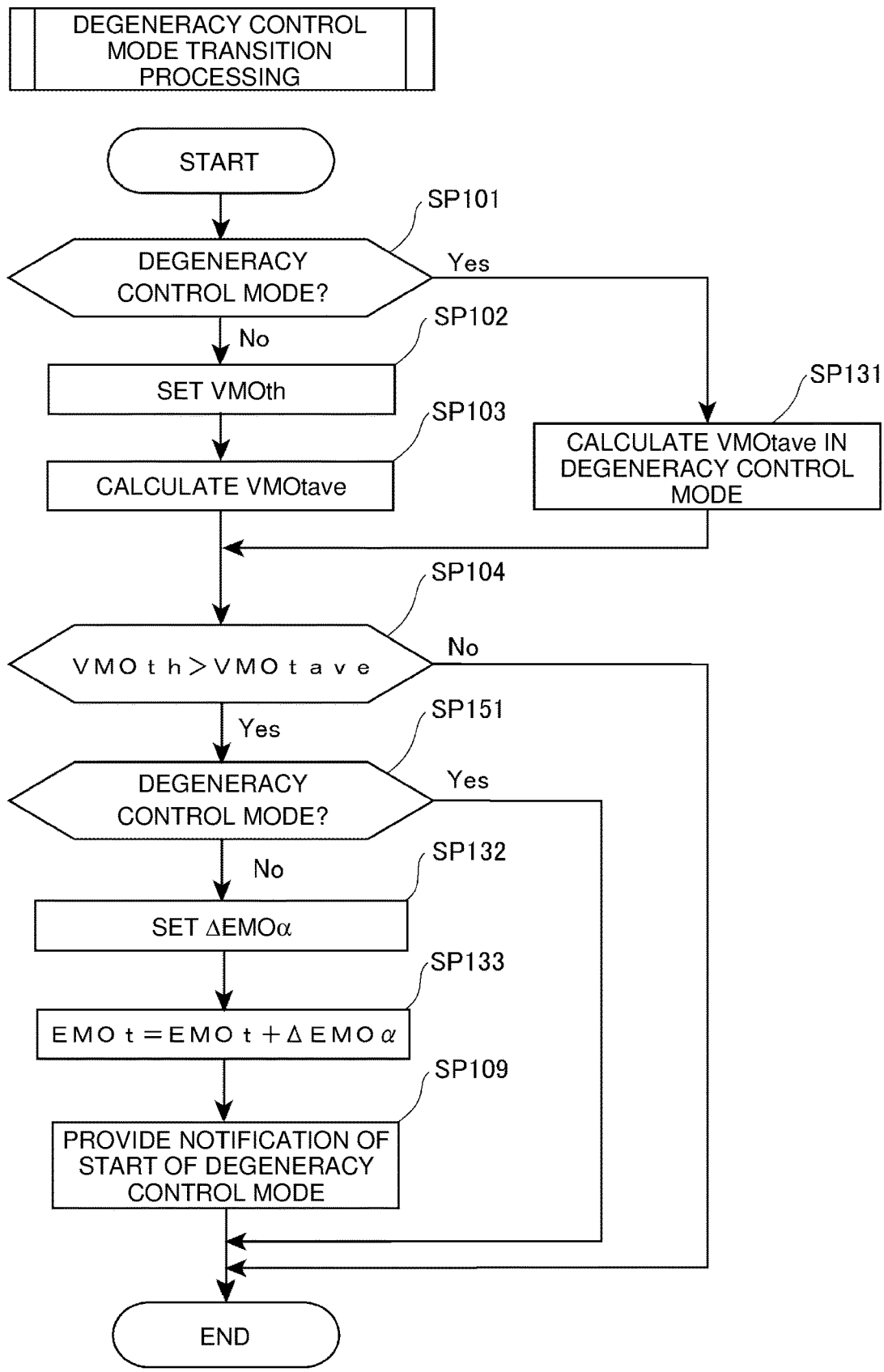
FIG. 20 is a control flowchart of the processor in degeneracy control mode transition processing of Embodiment 3.

FIG. 20 is a control flowchart of the processor 190 in the degeneracy control mode transition processing at step SP16 of the present embodiment. This control flowchart includes step SP151 between steps SP104 and SP132 and does not need step SP134, which is the difference from the degeneracy control mode transition processing of Embodiment 2 described above with reference to FIG. 17.

(Step SP104)

At the present step, when the moving average value VMOtave is smaller than the threshold VMOth, the processor 190 advances the control process to step SP151.

(Step SP151)

At the present step, when the control mode is the degeneracy control mode, the processor 190 ends the control process in the degeneracy control mode transition processing and advances the control process to step SP17. When the current control mode is not the degeneracy control mode, the processor 190 advances the control process to step SP132.

The control process advances in the order of steps SP17, SP14, SP15, and SP13 after the degeneracy control mode transition processing. In this case, the processor 190 controls the pulse power module 43 so that the voltage VMO at the target value VMOt set based on a new target value EMOt is applied to the electrodes 32a and 32b of the laser oscillator 130 at step SP42 as described above for step SP71. For example, the time point t1 illustrated in FIG. 19 is a time point at which the moving average value VMOtave becomes smaller than the threshold VMOth at step SP104. In this case, at step SP133, a new target value EMOt is set to EMOmax obtained by adding the addition amount ΔEMOα to the target value EMOt, and the target value VMOt at step SP42 is equal to the voltage VMOmax obtained by adding the addition amount ΔVMOα to the threshold VMOth. In FIG. 19, t13 denotes a time point at which the target value VMOt becomes equal to the voltage VMOmax. At the time point t13 and later, as in the output variation control mode, the pulse energy of the PO transmission light increases, and accordingly, the voltage VMOα tends to gradually decrease by the control amount ΔVMO.

Figure 21:
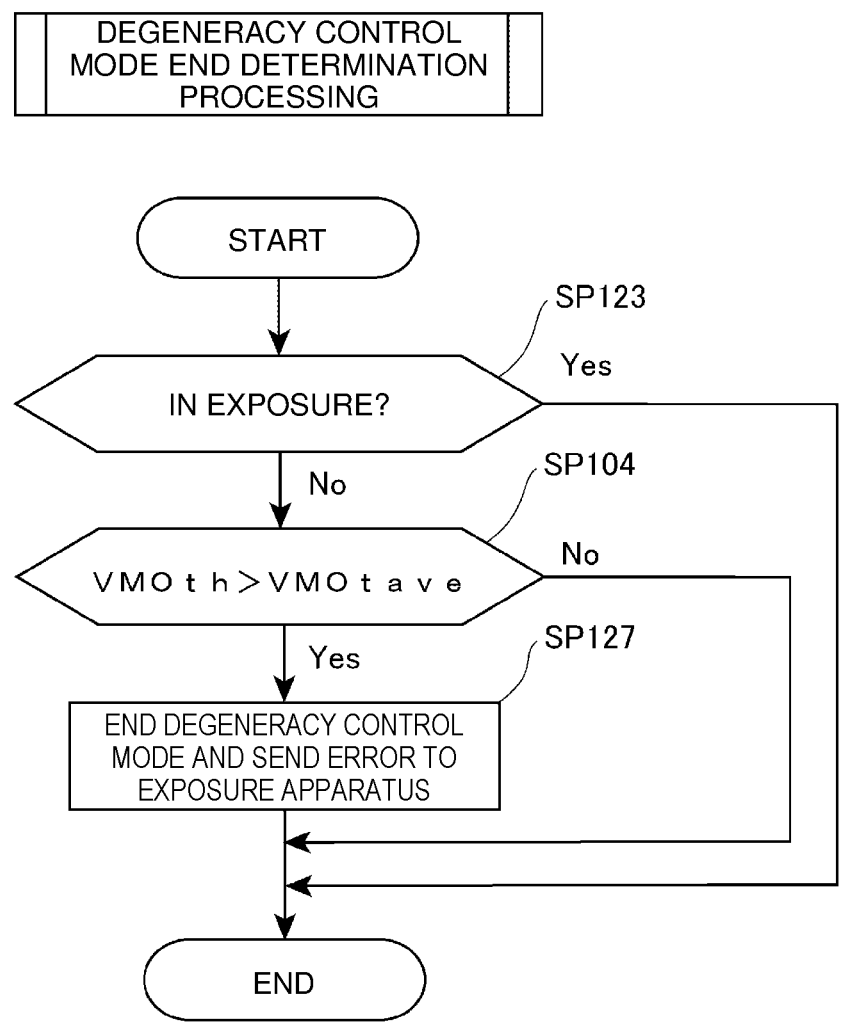
FIG. 21 is a control flowchart of the processor in degeneracy control mode end determination processing of Embodiment 3.

FIG. 21 is a control flowchart of the processor 190 in the degeneracy control mode end determination processing at step SP17 of the present embodiment. This control flowchart does not need step SP121 but includes step SP104 in place of steps SP141 to SP143, which is the difference from the degeneracy control mode end determination processing of Embodiment 2 described above with reference to FIG. 18.
(Step SP104)

At the present step, when the moving average value VMOtave is equal to or larger than the threshold VMOth, the processor 190 ends the control process in the degeneracy control mode end determination processing and advances the control process to step SP17. When the moving average value VMOtave is smaller than the threshold VMOth, the processor 190 advances the control process to step SP127.

5.3 Effect

In the gas laser apparatus 100 of the present embodiment, the processor 190 stops application of the voltage VMO when the moving average value VMOtave of the target value VMOt of the voltage VMO after increased to the predetermined voltage VMOmax is smaller than the threshold VMOth. With the above-described configuration, unlike Embodiment 2, it is unnecessary to increase the target value EMOt of pulse energy each time the moving average value VMOtave of the voltage VMO becomes smaller than the threshold VMOth. Thus, with the above-described configuration, a load on the processor 190 can be reduced.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A gas laser apparatus comprising:
a laser oscillator including a pair of discharge electrodes and a laser-side resonator, the pair of discharge electrodes being disposed to face each other and configured to generate light from laser gas upon application of voltage, the laser-side resonator being configured to cause the light to resonate;
an amplifier including an amplification unit and an amplification-side resonator, the amplification unit being configured to amplify the light transmitting through the laser-side resonator, the amplification-side resonator being configured to cause the light amplified by the amplification unit to resonate;
a beam splitter configured to reflect a part of the light from the laser-side resonator;
an optical sensor configured to detect the light reflected by the beam splitter; and
a processor configured to control the voltage based on an output from the optical sensor,
the amplification-side resonator including
a rear mirror that transmits a part of the light from the laser-side resonator, reflects another part of the light from the laser-side resonator toward the laser-side resonator, transmits a part of the light amplified by the amplification unit toward the laser-side resonator, and reflects another part of the light amplified by the amplification unit, and
an amplification-side output coupling mirror that reflects a part of the light amplified by the amplification unit and transmits another part of the light amplified by the amplification unit,
the laser-side resonator including
a grating that reflects the light generated from the laser gas, and
a laser-side output coupling mirror that reflects a part of the light generated from the laser gas, transmits another part of the light generated from the laser gas toward the beam splitter, and reflects a part of the light from the rear mirror toward the beam splitter,
the processor being configured to maintain the voltage at a constant value equal to or larger than a threshold of the voltage when the voltage is to be smaller than the threshold.

2. The gas laser apparatus according to claim 1, wherein the constant value is larger than the threshold.

3. The gas laser apparatus according to claim 1, wherein the constant value is equal to the threshold.

4. The gas laser apparatus according to claim 1, wherein the processor maintains the voltage at the constant value when a moving average value of the voltage is smaller than the threshold.

5. The gas laser apparatus according to claim 1, further comprising a display unit configured to provide notification of start of maintaining the voltage at the constant value.

6. The gas laser apparatus according to claim 5, wherein a signal indicating a number of pulses of the light is input from the optical sensor to the processor, and
the processor stops application of the voltage when a cumulated value of the number of pulses since start of the notification is larger than a cumulated threshold that is a threshold of the cumulated value.

7. The gas laser apparatus according to claim 6, wherein when the cumulated value is larger than the cumulated threshold, the processor outputs a signal indicating error to an exposure apparatus that the light from the amplification-side output coupling mirror enters.

8. A gas laser apparatus comprising:
a laser oscillator including a pair of discharge electrodes and a laser-side resonator, the pair of discharge electrodes being disposed to face each other and configured to generate light from laser gas upon application of voltage, the laser-side resonator being configured to cause the light to resonate;
an amplifier including an amplification unit and an amplification-side resonator, the amplification unit being configured to amplify the light transmitting through the laser-side resonator, the amplification-side resonator being configured to cause the light amplified by the amplification unit to resonate;
a beam splitter configured to reflect a part of the light from the laser-side resonator;
an optical sensor configured to detect the light reflected by the beam splitter; and
a processor configured to control the voltage based on an output from the optical sensor,
the amplification-side resonator including
a rear mirror that transmits a part of the light from the laser-side resonator, reflects another part of the light from the laser-side resonator toward the laser-side resonator, transmits a part of the light amplified by the amplification unit toward the laser-side resonator, and reflects another part of the light amplified by the amplification unit, and an amplification-side output coupling mirror that reflects a part of the light amplified by the amplification unit and transmits another part of the light amplified by the amplification unit, the laser-side resonator including a grating that reflects the light generated from the laser gas, and a laser-side output coupling mirror that reflects a part of the light generated from the laser gas, transmits another part of the light generated from the laser gas toward the beam splitter, and reflects a part of the light from the rear mirror toward the beam splitter, the processor being configured to increase the voltage to a predetermined value larger than a threshold of the voltage when the voltage is to be smaller than the threshold.

9. The gas laser apparatus according to claim 8, wherein the processor increases the voltage to the predetermined value when a moving average value of the voltage is smaller than the threshold.

10. The gas laser apparatus according to claim 8, further comprising a display unit configured to provide notification of start of increase of the voltage to the predetermined value.

11. The gas laser apparatus according to claim 8, wherein the processor increases the voltage to the predetermined value again when the voltage increased to the predetermined value is to be smaller than the threshold.

12. The gas laser apparatus according to claim 11, wherein the processor increases a target value of pulse energy of the light each time the voltage becomes smaller than the threshold, and stops application of the voltage when the target value is larger than a target threshold that is a threshold of the target value.

13. The gas laser apparatus according to claim 12, wherein when the target value is larger than the target threshold, the processor outputs a signal indicating error to an exposure apparatus that the light from the amplification-side output coupling mirror enters.

14. The gas laser apparatus according to claim 8, wherein the processor stops application of the voltage when a moving average value of the voltage after increased to the predetermined value is smaller than the threshold.

15. The gas laser apparatus according to claim 14, wherein when the moving average value is smaller than the threshold, the processor outputs a signal indicating error to the exposure apparatus that the light from the amplification-side output coupling mirror enters.

16. An electronic device manufacturing method comprising:

generating a laser beam with a gas laser apparatus including a laser oscillator including a pair of discharge electrodes and a laser-side resonator, the pair of discharge electrodes being disposed to face each other and configured to generate light from laser gas upon application of voltage, the laser-side resonator being configured to cause the light to resonate, an amplifier including an amplification unit and an amplification-side resonator, the amplification unit being configured to amplify the light transmitting through the laser-side resonator, the amplification-side resonator being configured to cause the light amplified by the amplification unit to resonate, a beam splitter configured to reflect a part of the light from the laser-side resonator, an optical sensor configured to detect the light reflected by the beam splitter, and a processor configured to control the voltage based on an output from the optical sensor, the amplification-side resonator including a rear mirror that transmits a part of the light from the laser-side resonator, reflects another part of the light from the laser-side resonator toward the laser-side resonator, transmits a part of the light amplified by the amplification unit toward the laser-side resonator, and reflects another part of the light amplified by the amplification unit, and an amplification-side output coupling mirror that reflects a part of the light amplified by the amplification unit and transmits another part of the light amplified by the amplification unit, the laser-side resonator including a grating that reflects the light generated from the laser gas, and a laser-side output coupling mirror that reflects a part of the light generated from the laser gas, transmits another part of the light generated from the laser gas toward the beam splitter, and reflects a part of the light from the rear mirror toward the beam splitter, the processor being configured to maintain the voltage at a constant value equal to or larger than a threshold of the voltage when the voltage is to be smaller than the threshold;

outputting the laser beam to an exposure apparatus; and exposing a photosensitive substrate to the laser beam in the exposure apparatus to manufacture an electronic device.

17. An electronic device manufacturing method comprising:

generating a laser beam with a gas laser apparatus including a laser oscillator including a pair of discharge electrodes and a laser-side resonator, the pair of discharge electrodes being disposed to face each other and configured to generate light from laser gas upon application of voltage, the laser-side resonator being configured to cause the light to resonate, an amplifier including an amplification unit and an amplification-side resonator, the amplification unit being configured to amplify the light transmitting through the laser-side resonator, the amplification-side resonator being configured to cause the light amplified by the amplification unit to resonate, a beam splitter configured to reflect a part of the light from the laser-side resonator, an optical sensor configured to detect the light reflected by the beam splitter, and a processor configured to control the voltage based on an output from the optical sensor, the amplification-side resonator including a rear mirror that transmits a part of the light from the laser-side resonator, reflects another part of the light from the laser-side resonator toward the laser-side resonator, transmits a part of the light amplified by the amplification unit toward the laser-side resonator, and reflects another part of the light amplified by the amplification unit, and an amplification-side output coupling mirror that reflects a part of the light amplified by the amplification unit and transmits another part of the light amplified by the amplification unit, the laser-side resonator including
- a grating that reflects the light generated from the laser gas, and
- a laser-side output coupling mirror that reflects a part of the light generated from the laser gas, transmits another part of the light generated from the laser gas toward the beam splitter, and reflects a part of the light from the rear mirror toward the beam splitter, the processor being configured to increase the voltage to a predetermined value larger than a threshold of the voltage when the voltage is to be smaller than the threshold;

outputting the laser beam to an exposure apparatus; and exposing a photosensitive substrate to the laser beam in the exposure apparatus to manufacture an electronic device.

* * * * *